US012621953B1

(12) United States Patent
Krietzman et al.

(10) Patent No.: US 12,621,953 B1
(45) Date of Patent: **\*May 5, 2026**

(54) FRAME STRUCTURE FOR ELECTRONIC EQUIPMENT ENCLOSURE

(71) Applicant: CHATSWORTH PRODUCTS, INC., Simi Valley, CA (US)

(72) Inventors: William Drew Krietzman, Rathdrum, ID (US); Preston Ellis Hennrich, Leander, TX (US)

(73) Assignee: CHATSWORTH PRODUCTS, INC., Simi Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/965,273

(22) Filed: Dec. 2, 2024

Related U.S. Application Data

(63) Continuation of application No. 18/377,783, filed on Oct. 7, 2023, now Pat. No. 12,160,974, which is a
(Continued)

(51) Int. Cl.
H05K 7/18 (2006.01)
(52) U.S. Cl.
CPC ..................................... H05K 7/18 (2013.01)
(58) Field of Classification Search
CPC ...... H05K 7/183; H05K 7/186; H05K 7/1488; H05K 7/20709; H05K 7/14; H05K 7/18;
(Continued)

(56) References Cited

U.S. PATENT DOCUMENTS 4,411,552 A    10/1983  Lanham et al.
5,695,263 A *  12/1997  Simon .................... H05K 7/183
                                                          403/231
(Continued)

FOREIGN PATENT DOCUMENTS

DE      10308389 A1 *  9/2004  ............... H02B 1/20
EP       0144955 A2 *  6/1985  ............. H02B 1/308
(Continued)

OTHER PUBLICATIONS

Information Disclosure Statement (IDS) Letter Regarding Common Patent Application(s), dated Jul. 28, 2025.
(Continued)

*Primary Examiner* — Patrick D Hawn
(74) *Attorney, Agent, or Firm* — TILLMAN WRIGHT, PLLC; James D. Wright; David R. Higgins

(57) ABSTRACT

A frame structure for an electronic equipment enclosure includes vertical frame members and horizontal frame members arranged to form rear and front frames connected together via horizontal front-to-back members. At least one of the vertical frame members includes a closed profile and a vertical channel extending a length thereof for providing access to an adjustment assembly of a leveling foot. The adjustment assembly is positioned within the vertical channel and outside of the closed profile. At least one of the horizontal frame or front-to-back members is a structural member having a closed profile that includes at least one T-slot channel and at least one recessed groove extending a length thereof. The at least one recessed groove includes a row of mounting apertures arranged therein.

23 Claims, 22 Drawing Sheets

Related U.S. Application Data continuation of application No. 17/662,630, filed on May 9, 2022, now Pat. No. 11,818,862, and a continuation of application No. 17/662,624, filed on May 9, 2022, now Pat. No. 11,818,861, which is a continuation of application No. 17/550,989, filed on Dec. 14, 2021, now Pat. No. 11,818,860, said application No. 17/662,630 is a continuation of application No. 17/550,989, filed on Dec. 14, 2021, now Pat. No. 11,818,860, said application No. 18/377,783 is a continuation of application No. 17/550,989, filed on Dec. 14, 2021, now Pat. No. 11,818,860.

(60) Provisional application No. 63/125,506, filed on Dec. 15, 2020.

(58) Field of Classification Search
CPC ...... H05K 5/0217; H05K 5/0234; H02B 1/01; H02B 1/013; H02B 1/014; H02B 1/301
See application file for complete search history.

(56) References Cited

U.S. PATENT DOCUMENTS

| | | | | |
|---|---|---|---|---|
| 6,024,330 | A * | 2/2000 | Mroz | F16M 7/00 248/188.4 |
| 6,270,283 | B1 * | 8/2001 | Turati | H02B 1/301 403/219 |
| 6,315,132 | B1 * | 11/2001 | Hartel | H02B 1/301 361/829 |
| 6,394,398 | B1 * | 5/2002 | Reed | H05K 7/1491 248/57 |
| 6,520,345 | B1 * | 2/2003 | Marovic | H02B 1/01 211/183 |
| 6,831,225 | B2 * | 12/2004 | Chandler | H05K 7/1457 361/600 |
| 7,425,678 | B2 * | 9/2008 | Adducci | E05D 15/502 174/53 |
| 7,974,105 | B2 * | 7/2011 | Dean, Jr. | G02B 6/44526 361/826 |
| 9,185,824 | B2 * | 11/2015 | Nordin | H05K 7/183 |
| 9,943,003 | B2 * | 4/2018 | Segroves | H05K 7/1491 |
| 10,182,651 | B2 * | 1/2019 | Jost | A47B 96/06 |
| 10,334,748 | B1 | 6/2019 | Kostenko et al. | |
| 11,444,438 | B2 * | 9/2022 | Schindler | H05K 7/183 |
| 11,622,469 | B2 * | 4/2023 | Waz | H05K 7/1488 174/50 |
| 12,082,379 | B2 | 9/2024 | Lewis, II et al. | |
| 12,089,363 | B1 | 9/2024 | Krietzman et al. | |
| 12,108,553 | B2 | 10/2024 | Garza, Jr. et al. | |
| 12,135,103 | B2 | 11/2024 | Hennrich et al. | |
| 12,160,974 | B1 | 12/2024 | Krietzman et al. | |
| 12,264,698 | B2 | 4/2025 | Davis | |
| 12,342,486 | B1 | 6/2025 | Hennrich et al. | |
| 12,428,888 | B1 | 9/2025 | Krietzman et al. | |
| 2006/0102575 | A1 | 5/2006 | Mattlin et al. | |
| 2007/0257169 | A1 * | 11/2007 | Taggett | A47B 96/068 248/220.41 |
| 2008/0036339 | A1 | 2/2008 | Adducci et al. | |
| 2008/0036340 | A1 | 2/2008 | Adducci et al. | |
| 2008/0067903 | A1 | 3/2008 | Adducci et al. | |
| 2008/0074012 | A1 * | 3/2008 | Adducci | H05K 7/186 312/7.2 |
| 2008/0079340 | A1 | 4/2008 | Adducci et al. | |
| 2009/0134750 | A1 | 5/2009 | Adducci et al. | |
| 2010/0264788 | A1 | 10/2010 | Adducci et al. | |
| 2010/0300648 | A1 | 12/2010 | Grantham | |
| 2010/0315775 | A1 | 12/2010 | Grantham et al. | |
| 2011/0069450 | A1 | 3/2011 | Adducci et al. | |
| 2011/0084580 | A1 | 4/2011 | Adducci et al. | |
| 2011/0111686 | A1 | 5/2011 | Hruby et al. | |
| 2011/0278998 | A1 | 11/2011 | Caveney et al. | |
| 2012/0292278 | A1 * | 11/2012 | Schluter | H05K 7/1421 211/183 |
| 2017/0215587 | A1 * | 8/2017 | Jost | A47B 57/34 |
| 2017/0223864 | A1 * | 8/2017 | Jost | A47B 88/43 |
| 2020/0077533 | A1 * | 3/2020 | Lu | H05K 7/1488 |
| 2021/0219443 | A1 | 7/2021 | Curlee et al. | |
| 2025/0071920 | A1 | 2/2025 | Garza, Jr. et al. | |

FOREIGN PATENT DOCUMENTS

| | | | | |
|---|---|---|---|---|
| EP | 3806253 | A1 * | 4/2021 | H02G 3/0456 |
| ES | 2288005 | T3 * | 12/2007 | H02B 1/301 |
| GB | 2261993 | A * | 6/1993 | H02B 1/34 |
| KR | 20200107112 | A | 9/2020 | |
| TW | 201630514 | A * | 8/2016 | H05K 7/18 |
| WO | WO-9419850 | A1 * | 9/1994 | H05K 7/183 |
| WO | WO-0101533 | A1 * | 1/2001 | H02B 1/01 |
| WO | 2011143431 | A1 | 11/2011 | |

OTHER PUBLICATIONS

Information Disclosure Statement (IDS) Letter Regarding Common Patent Application(s), dated Oct. 22, 2025.
Information Disclosure Statement (IDS) Letter Regarding Common Patent Application(s), dated May 21, 2025.
Identification of Earlier Application Pursuant To 37 CFR 1.98(d)(1), dated May 21, 2025.

* cited by examiner

55

81

88

86

83

82

88

86

84

122

55

46

36

44

34

38

30

32

50

48

67

50

48

118

51

126

124

52

FRAME STRUCTURE FOR ELECTRONIC EQUIPMENT ENCLOSURE

CROSS-REFERENCE TO RELATED APPLICATIONS

The present application is a continuation patent application of, and claims priority under 35 U.S.C. § 120 to, U.S. nonprovisional patent application Ser. No. 18/377,783, filed Oct. 7, 2023, which '783 application issued on Dec. 3, 2024 as U.S. Pat. No. 12,160,974, which '783 application, any publication thereof, and the patent issuing therefrom are each incorporated by reference herein in their entirety, and which '783 application is a continuation patent application of, and claims priority under 35 U.S.C. § 120 to, each of:

(a) U.S. nonprovisional patent application Ser. No. 17/550,989, filed Dec. 14, 2021 and issued as U.S. Pat. No. 11,818,860 on Nov. 14, 2023, which '989 application, any application publication thereof, and the patent issuing therefrom are each expressly incorporated herein by reference in their entirety, and which '989 application is a U.S. nonprovisional patent application of, and claims priority under 35 U.S.C. § 119(e) to, U.S. provisional patent application Ser. No. 63/125,506, filed Dec. 15, 2020, which '506 application is incorporated by reference herein in its entirety;

(b) U.S. nonprovisional patent application Ser. No. 17/662,624, filed May 9, 2022 and issued as U.S. Pat. No. 11,818,861 on Nov. 14, 2023, which '624 application, any application publication thereof, and the patent issuing therefrom are each expressly incorporated herein by reference in their entirety, and which '624 application is a U.S. continuation patent application of, and claims priority under 35 U.S.C. § 120 to, U.S. nonprovisional patent application Ser. No. 17/550,989, filed Dec. 14, 2021 and issued as U.S. Pat. No. 11,818,860 on Nov. 14, 2023, which '989 application, any application publication thereof, and the patent issuing therefrom are each expressly incorporated herein by reference in their entirety, and which '989 application is a U.S. nonprovisional patent application of, and claims priority under 35 U.S.C. § 119(e) to, U.S. provisional patent application Ser. No. 63/125,506, filed Dec. 15, 2020, which '506 application is incorporated by reference herein in its entirety; and (c) U.S. nonprovisional patent application Ser. No. 17/662,630, filed May 9, 2022 and issued as U.S. Pat. No. 11,818,862 on Nov. 14, 2023, which '630 application, any application publication thereof, and the patent issuing therefrom are each expressly incorporated herein by reference in their entirety, and which '630 application is a U.S. continuation patent application of, and claims priority under 35 U.S.C. § 120 to, U.S. nonprovisional patent application Ser. No. 17/550,989, filed Dec. 14, 2021 and issued as U.S. Pat. No. 11,818,860 on Nov. 14, 2023, which '989 application, any application publication thereof, and the patent issuing therefrom are each expressly incorporated herein by reference in their entirety, and which '989 application is a U.S. nonprovisional patent application of, and claims priority under 35 U.S.C. § 119(e) to, U.S. provisional patent application Ser. No. 63/125,506, filed Dec. 15, 2020, which '506 application is incorporated by reference herein in its entirety.

Additionally, the entirety of each of the following commonly-assigned U.S. provisional patent applications is incorporated herein by reference:

(a) U.S. provisional patent application Ser. No. 63/125,489, filed Dec. 15, 2020, and entitled, "SLIDABLE MOUNTING HARDWARE FOR ELECTRONIC EQUIPMENT ENCLOSURE," attached hereto as Appendix A;

(b) U.S. provisional patent application Ser. No. 63/125,499, filed Dec. 15, 2020, and entitled, "CASTER ATTACHMENT SYSTEM USING MATING FEATURES," attached hereto as Appendix B; and (c) U.S. provisional patent application Ser. No. 63/125,504, filed Dec. 15, 2020, and entitled, "BRUSH PORT ASSEMBLY," attached hereto as Appendix C.

The disclosure of each of the foregoing U.S. provisional patent applications is contained in the corresponding appendix, as designated above, each of which is likewise incorporated herein in its entirety by reference and is intended to provide background and technical information with regard to the systems and environments of the inventions of the current nonprovisional patent application.

COPYRIGHT STATEMENT

BACKGROUND OF THE PRESENT INVENTION

Field of the Present Invention

The present invention relates generally to frame structures for electronic equipment enclosures and cabinets, and, in particular, to sturdy and adaptable frame structures for electronic equipment enclosures and cabinets capable of accommodating a variety of different parts and accessories.

Background

Equipment enclosures, such as frames, cabinets, and the like for supporting computer and other electronic equipment, are very well known. Such equipment enclosures are often partially or fully enclosed, either directly or through the use of doors and panels mounted directly thereon, and a sturdy frame structure is relied upon to support equipment mounted therein along with a variety of accessories and other appurtenant structures.

Frame structures for equipment enclosures are usually comprised of a combination of interconnected horizontal and vertical structural members. These often include four vertical or upright members, four side-to-side members, and four to six front-to-back members.

Structural members for frame structures are commonly produced using one of a few different well-known methods. In one such method, structural members are produced using sheet metal to form a shape having an open cross-section. Structural members produced in this manner are not usually as strong owing to the open nature of the cross-sectional profile. In another method, structural members are produced using tubular steel, which results in a generally square or rectangular cross-sectional shape. These structural members usually exhibit higher strength properties. In yet another method, which is common for front-to-back structural members, an extrusion process is used to form a custom-shaped aluminum structural member that includes features for mounting rails or accessories. Aluminum structural members are usually bolted to other structural members because of the dissimilarity of adjoining metal materials in the frame structure.

Unfortunately, known high-capacity frame structures do not regularly exhibit a wide range of features that support adaptability of the frame structure to meet a variety of different positioning and adjustment needs. On the other hand, known frame structures that facilitate a high degree of adjustability can exhibit structural weakness in some joints or interconnections based on how the frame has been assembled. As such, a need exists for a frame structure for electronic equipment enclosures and cabinets that exhibits both enhanced strength and adaptability. This and/or other needs are addressed by one or more aspects of the present invention.

SUMMARY OF THE PRESENT INVENTION

Some exemplary embodiments of the present invention may overcome one or more of the above disadvantages and other disadvantages not described above, but the present invention is not required to overcome any particular disadvantage described above, and some exemplary embodiments of the present invention may not overcome any of the disadvantages described above.

The present invention includes many aspects and features. Moreover, while many aspects and features relate to, and are described in, the context of frame structures for electronic equipment enclosures and cabinets, the present invention is not limited to use only in frame structures for electronic equipment enclosures and cabinets, as will become apparent from the following summaries and detailed descriptions of aspects, features, and one or more embodiments of the present invention.

Broadly defined, the present invention according to one aspect relates to a frame structure for an electronic equipment enclosure. The frame structure includes a pair of front vertical frame members, a pair of rear vertical frame members, a pair of front horizontal side-to-side members that connect respective upper ends of the pair of front vertical frame members and respective lower ends of the pair of front vertical frame members, thereby forming a front frame, a pair of rear horizontal side-to-side members that connect respective upper ends of the pair of rear vertical frame members and respective lower ends of the pair of rear vertical frame members, thereby forming a rear frame, and at least four horizontal front-to-back members that connect the front frame and the rear frame. One or more of the horizontal side-to-side members and the horizontal front-to-back members is a structural member having a closed profile and including at least one T-slot channel and at least one recessed groove extending a length thereof. The at least one recessed groove includes a row of mounting apertures arranged therein.

In a feature of this aspect, the at least one recessed groove is arranged along an interior-facing surface of the structural member.

In another feature of this aspect, the at least one T-slot channel is arranged along a top-facing surface of the structural member.

In another feature of this aspect, the at least one T-slot channel is arranged along an interior-facing surface of the structural member.

In another feature of this aspect, the structural member is a steel structural member.

In another feature of this aspect, the structural member includes at least one inset area extending the length thereof for accommodating one or more panels thereagainst without interfering with an adjacent structure.

In another feature of this aspect, the at least one T-slot channel is adapted to accommodate a portion of a fastener therein, and a position of the fastener relative to the structural member is infinitely adjustable within a range defined by the length of the structural member.

In another feature of this aspect, the at least one T-slot channel is adapted to accommodate a tab of an accessory structure against a ledge thereof for alignment of the accessory structure against the structural member.

In another feature of this aspect, the at least one recessed groove is adapted to accommodate a recessed portion of an accessory part so that the accessory part is self-alignable with the structural member.

In another feature of this aspect, each mounting aperture includes a boss at an interior of the closed profile of the structural member.

In another feature of this aspect, at least one of a pair of interconnecting vertical frame members and horizontal members of the frame structure includes one or more tabs that are received within a corresponding cutout of the other of the pair of interconnecting vertical frame members and horizontal members.

Broadly defined, the present invention according to another aspect relates to a frame structure for an electronic equipment enclosure. The frame structure includes a pair of front vertical frame members, a pair of rear vertical frame members, a pair of front horizontal side-to-side members that connect respective upper ends of the pair of front vertical frame members and respective lower ends of the pair of front vertical frame members, thereby forming a front frame, a pair of rear horizontal side-to-side members that connect respective upper ends of the pair of rear vertical frame members and respective lower ends of the pair of rear vertical frame members, thereby forming a rear frame, and at least four horizontal front-to-back members that connect the front frame and the rear frame. One or more of the front vertical frame members and the rear vertical frame members includes a closed profile and a channel extending a length thereof for providing access to an adjustment assembly of a leveling foot of the frame structure. The adjustment assembly is positioned within the channel and outside of the closed profile.

In a feature of this aspect, the channel is a V-shaped channel.

In another feature of this aspect, one or more of the front vertical frame members and the rear vertical frame members includes a cutaway for receiving an end of one of the horizontal frame members. In another feature of this aspect, a bottom interior-facing surface of the channel is connected to the end of the horizontal frame member received within the cutaway. In another feature of this aspect, the connection between the channel and the end of the horizontal frame member is a weld connection.

In another feature of this aspect, the adjustment assembly includes a vertically-oriented stud having a recess at a top-facing surface thereof that is received through an opening in a support block mounted to the frame structure, and a height of the leveling foot is adjustable from above the leveling foot by rotation of the stud. In another feature of this aspect, the recess is a hexagonal-shaped recess.

In another feature of this aspect, one or more of the front vertical frame members and the rear vertical frame members includes at least one inset area extending the length thereof for accommodating one or more panels thereagainst without interfering with an adjacent structure.

In another feature of this aspect, at least one of a pair of interconnecting vertical frame members and horizontal members of the frame structure includes one or more tabs that are received within a corresponding cutout of the other of the pair of interconnecting vertical frame members and horizontal members.

In another feature of this aspect, a bottom end of the channel is welded to a lower one of the horizontal members, thereby facilitating transfer of an equipment load from the vertical frame member, through the lower one of the horizontal members, and to a support block arranged therebeneath.

Broadly defined, the present invention according to another aspect relates to a method of installing an accessory part in an electronic equipment enclosure. The method includes: providing an electronic equipment enclosure having a frame structure that includes a plurality of interconnected vertical and horizontal frame members, wherein at least one of the horizontal frame members includes at least one T-slot channel and at least one recessed groove extending a length thereof, the at least one recessed groove including a row of mounting apertures arranged therein; providing an accessory part including a recessed area and an elongate opening arranged in the recessed area; positioning the accessory part such that the recessed area is aligned within the at least one recessed groove; and arranging a fastener through the elongate opening of the accessory part and a selected one of the mounting apertures of the at least one recessed groove such that the fastener does not protrude beyond a surface of the accessory part.

In a feature of this aspect, the method further includes positioning a tab of the accessory part against a ledge of the at least one T-shaped channel.

In another feature of this aspect, the method further includes adjusting a position of the accessory part relative to the frame structure by shifting a position of the fastener within the elongate opening of the accessory part.

In another feature of this aspect, the method further includes adjusting a position of the accessory part relative to the frame structure by removing the fastener from the selected one of the mounting apertures and arranging the fastener through a different one of the mounting apertures.

In another feature of this aspect, the fastener is a thread-forming fastener. In another feature of this aspect, the method further includes establishing an electrical bonding connection from the accessory part to the frame structure through the thread-forming fastener.

Broadly defined, the present invention according to another aspect relates to a method of adjusting a height of an electronic equipment enclosure. The method includes: providing an electronic equipment enclosure having a frame structure that includes a plurality of interconnected vertical and horizontal frame members, each of the vertical members having a closed profile and a channel extending a length thereof for providing access to an adjustment assembly of a leveling foot of the frame structure, wherein the adjustment assembly is positioned within the channel and outside of the closed profile, the adjustment assembly includes a stud having a recess at a top-facing surface thereof, and the stud is received through an opening in a support block mounted to the frame structure; positioning a tool within the recess of the stud from above the leveling foot; and rotating the stud using the tool to adjust a height of the leveling foot from above the leveling foot.

In a feature of this aspect, the recess is a hexagonal-shaped recess.

Broadly defined, the present invention according to another aspect relates to a frame structure for an electronic equipment enclosure substantially as shown and described.

Broadly defined, the present invention according to another aspect relates to an electronic equipment enclosure substantially as shown and described.

Broadly defined, the present invention according to another aspect relates to a method of installing an accessory part in an electronic equipment enclosure substantially as shown and described.

Broadly defined, the present invention according to another aspect relates to a method of adjusting a height of an electronic equipment enclosure substantially as shown and described.

Broadly defined, the present invention according to another aspect relates to a frame structure for an electronic equipment enclosure. The frame structure includes a pair of front vertical frame members, a pair of rear vertical frame members, and a plurality of horizontal frame members. The plurality of horizontal frame members includes a pair of front horizontal side-to-side members that connect respective upper ends of the pair of front vertical frame members and respective lower ends of the pair of front vertical frame members, thereby forming a front frame, a pair of rear horizontal side-to-side members that connect respective upper ends of the pair of rear vertical frame members and respective lower ends of the pair of rear vertical frame members, thereby forming a rear frame, and at least four horizontal front-to-back members that connect the front frame and the rear frame. One or more of the horizontal side-to-side members and the horizontal front-to-back members is a structural member having a closed profile that includes at least one T-slot channel and at least one recessed groove extending a length thereof. The at least one recessed groove includes a row of mounting apertures arranged therein.

In a feature of this aspect, the at least one recessed groove is arranged along an interior-facing surface of the structural member.

In another feature of this aspect, the at least one T-slot channel is arranged along a top-facing surface of the structural member.

In another feature of this aspect, the at least one T-slot channel is arranged along an interior-facing surface of the structural member.

In another feature of this aspect, the structural member is a steel structural member.

In another feature of this aspect, the structural member includes at least one inset area extending the length thereof for accommodating one or more panels thereagainst without interfering with an adjacent structure.

In another feature of this aspect, each mounting aperture includes a boss at an interior of the closed profile of the structural member.

In another feature of this aspect, at least one frame member of a pair of interconnected frame members of the frame structure includes one or more tabs that are received within a corresponding cutout of the other frame member of the pair of interconnected frame members.

Broadly defined, the present invention according to another aspect relates to a frame structure for an electronic equipment enclosure. The frame structure includes a pair of front vertical frame members, a pair of rear vertical frame members, and a plurality of horizontal frame members. The plurality of horizontal frame members includes a pair of front horizontal side-to-side members that connect respective upper ends of the pair of front vertical frame members and respective lower ends of the pair of front vertical frame members, thereby forming a front frame, a pair of rear horizontal side-to-side members that connect respective upper ends of the pair of rear vertical frame members and respective lower ends of the pair of rear vertical frame members, thereby forming a rear frame, and at least four horizontal front-to-back members that connect the front frame and the rear frame. The at least one of the front vertical frame members and the rear vertical frame members includes a closed profile and a channel extending a length thereof for providing access to an adjustment assembly of a leveling foot. The adjustment assembly is positioned within the channel and outside of the closed profile.

In a feature of this aspect, the channel is a V-shaped channel.

In another feature of this aspect, the at least one of the front vertical frame members and the rear vertical frame members includes a cutaway for receiving an end of one of the horizontal frame members. In another feature of this aspect, a bottom interior-facing surface of the channel is connected to the end of the horizontal frame member received within the cutaway. In another feature of this aspect, the connection between the bottom interior-facing surface of the channel and the end of the horizontal frame member is a weld connection.

In another feature of this aspect, the adjustment assembly includes a vertically-oriented stud having a recess at a top-facing surface thereof that is received through an opening in a support block mounted to the frame structure, and a height of the leveling foot is adjustable from above the leveling foot by rotation of the stud. In another feature of this aspect, the recess is a hexagonal-shaped recess.

In another feature of this aspect, one or more of the front vertical frame members and the rear vertical frame members includes at least one inset area extending the length thereof for accommodating one or more panels thereagainst without interfering with an adjacent structure.

In another feature of this aspect, at least one frame member of a pair of interconnected frame members of the frame structure includes one or more tabs that are received within a corresponding cutout of the other frame member of the pair of interconnected frame members.

In another feature of this aspect, a bottom end of the channel is connected to a lower one of the horizontal frame members via a weld connection, thereby facilitating transfer of an equipment load from the vertical frame member, through the lower one of the horizontal frame members, and to a support block arranged therebeneath.

Broadly defined, the present invention according to another aspect relates to a frame structure for an electronic equipment enclosure. The frame structure includes a pair of front vertical frame members, a pair of rear vertical frame members, and a plurality of horizontal frame members. The plurality of horizontal frame members includes a pair of front horizontal side-to-side members that connect respective upper ends of the pair of front vertical frame members and respective lower ends of the pair of front vertical frame members, thereby forming a front frame, a pair of rear horizontal side-to-side members that connect respective upper ends of the pair of rear vertical frame members and respective lower ends of the pair of rear vertical frame members, thereby forming a rear frame, and at least four horizontal front-to-back members that connect the front frame and the rear frame. At least one of the front vertical frame members and the rear vertical frame members includes a closed profile and a vertical channel extending a length thereof for providing access to an adjustment assembly of a leveling foot. The adjustment assembly is positioned within the vertical channel and outside of the closed profile. At least one of the horizontal side-to-side members and the horizontal front-to-back members is a structural member having a closed profile that includes at least one T-slot channel and at least one recessed groove extending a length thereof. The at least one recessed groove includes a row of mounting apertures arranged therein.

In a feature of this aspect, the vertical channel is a V-shaped channel.

In another feature of this aspect, the at least one of the front vertical frame members and the rear vertical frame members includes a cutaway for receiving an end of one of the horizontal frame members. In another feature of this aspect, a bottom interior-facing surface of the vertical channel is connected to the end of the horizontal frame member received within the cutaway. In another feature of this aspect, the connection between the bottom interior-facing surface of the vertical channel and the end of the horizontal frame member is a weld connection.

In another feature of this aspect, the adjustment assembly includes a vertically-oriented stud having a recess at a top-facing surface thereof that is received through an opening in a support block mounted to the frame structure, and a height of the leveling foot is adjustable from above the leveling foot by rotation of the stud. In another feature of this aspect, the recess is a hexagonal-shaped recess.

In another feature of this aspect, one or more of the front vertical frame members and the rear vertical frame members includes at least one inset area extending the length thereof for accommodating one or more panels thereagainst without interfering with an adjacent structure.

In another feature of this aspect, at least one frame member of a pair of interconnected frame members of the frame structure includes one or more tabs that are received within a corresponding cutout of the other frame member of the pair of interconnected frame members.

In another feature of this aspect, a bottom end of the vertical channel is connected to a lower one of the horizontal frame members via a weld connection, thereby facilitating transfer of an equipment load from the vertical frame member, through the lower one of the horizontal frame members, and to a support block arranged therebeneath.

In another feature of this aspect, the at least one recessed groove is arranged along an interior-facing surface of the structural member.

In another feature of this aspect, the at least one T-slot channel is arranged along a top-facing surface of the structural member.

In another feature of this aspect, the at least one T-slot channel is arranged along an interior-facing surface of the structural member.

In another feature of this aspect, the structural member is a steel structural member.

In another feature of this aspect, the structural member includes at least one inset area extending the length thereof for accommodating one or more panels thereagainst without interfering with an adjacent structure.

In another feature of this aspect, each mounting aperture includes a boss at an interior of the closed profile of the structural member.

Broadly defined, the present invention according to another aspect relates to an electronic equipment structure. The electronic equipment structure includes a frame structure, an accessory part, and a fastener. The frame structure includes a plurality of interconnected vertical and horizontal frame members. At least one of the vertical frame members includes a closed profile and a channel extending a length thereof, and at least one of the horizontal frame members is a structural member having a closed profile that includes at least one T-slot channel and at least one recessed groove extending a length thereof. The at least one recessed groove includes a row of mounting apertures arranged therein. The accessory part includes a recessed area and an elongate opening located in the recessed area. The accessory part is arranged such that the recessed area is in alignment with the at least one recessed groove of the structural member. The fastener extends through each of the elongate opening of the accessory part and a selected one of the mounting apertures of the at least one recessed groove such that the fastener does not protrude beyond an outward-facing surface of the accessory part.

In a feature of this aspect, a hooking tab of the accessory part hooks over a ledge of the at least one T-slot channel.

In another feature of this aspect, a position of the accessory part relative to the frame structure is adjustable by shifting a position of the fastener within the elongate opening of the accessory part.

In another feature of this aspect, the at least one recessed groove is arranged along an interior-facing surface of the structural member.

In another feature of this aspect, each mounting aperture includes a boss at an interior of the closed profile of the structural member. In another feature of this aspect, the fastener is a thread-forming fastener. In another feature of this aspect, the thread-forming fastener penetrates a coating at an inner surface of the boss at the selected one of the mounting apertures to establish metal-on-metal contact between the thread-forming fastener and the structural member, thereby establishing an electrical bonding connection.

In another feature of this aspect, the at least one of the vertical frame members includes a cutaway for receiving an end of one of the horizontal frame members. In another feature of this aspect, a bottom interior-facing surface of the channel is connected to the end of the horizontal frame member received within the cutaway. In another feature of this aspect, the connection between the bottom interior-facing surface of the channel and the end of the horizontal frame member is a weld connection.

In another feature of this aspect, each of the vertical frame members and the horizontal frame members includes at least one inset area extending the length thereof. In another feature of this aspect, the electronic equipment structure further includes a plurality of panels seated within the inset areas such that the panels do not protrude beyond a footprint defined by the frame structure.

In another feature of this aspect, at least one frame member of a pair of interconnected frame members of the frame structure includes one or more tabs that are received within a corresponding cutout of the other frame member of the pair of interconnected frame members.

In another feature of this aspect, a bottom end of the channel is connected to a lower one of the horizontal frame members via a weld connection to facilitate transfer of an equipment load from the at least one vertical frame member, through the lower one of the horizontal frame members, and to a support block arranged therebeneath.

Broadly defined, the present invention according to another aspect relates to an electronic equipment structure. The electronic equipment structure includes a frame structure, a hardware component, an accessory part, and a nut. The frame structure includes a plurality of interconnected vertical and horizontal frame members. At least one of the vertical frame members includes a closed profile and a channel extending a length thereof, and at least one of the horizontal frame members is a structural member having a closed profile that includes at least one T-slot channel and at least one recessed groove extending a length thereof. The hardware component includes an oblong head seated transversely within the at least one T-slot channel to prevent inadvertent removal therefrom. The hardware component further includes a shaft extending outward from between opposed ledges of the at least one T-slot channel. The accessory part includes an elongate opening and is arranged such that shaft of the hardware component passes through the elongate opening. The nut is tightened on the shaft of the hardware component to secure the accessory part to the structural member.

In a feature of this aspect, a position of the hardware component relative to the structural member is infinitely adjustable within a range defined by the length of the structural member.

In another feature of this aspect, the at least one T-slot channel is arranged along a top-facing surface of the structural member.

In another feature of this aspect, the at least one T-slot channel is arranged along an interior-facing surface of the structural member.

In another feature of this aspect, the at least one of the vertical frame members includes a cutaway for receiving an end of one of the horizontal frame members. In another feature of this aspect, a bottom interior-facing surface of the channel is connected to the end of the horizontal frame member received within the cutaway. In another feature of this aspect, the connection between the bottom interior-facing surface of the channel and the end of the horizontal frame member is a weld connection.

In another feature of this aspect, each of the vertical frame members and the horizontal frame members includes at least one inset area extending the length thereof. In another feature of this aspect, the electronic equipment structure further includes a plurality of panels seated within the inset areas such that the panels do not protrude beyond a footprint defined by the frame structure.

In another feature of this aspect, at least one frame member of a pair of interconnected frame members of the frame structure includes one or more tabs that are received within a corresponding cutout of the other frame member of the pair of interconnected frame members.

In another feature of this aspect, a bottom end of the channel is connected to a lower one of the horizontal frame members via a weld connection to facilitate transfer of an equipment load from the at least one vertical frame member, through the lower one of the horizontal frame members, and to a support block arranged therebeneath.

Broadly defined, the present invention according to another aspect relates to an electronic equipment structure. The electronic equipment structure includes a frame structure and an adjustment assembly for a leveling foot. The frame structure includes a plurality of interconnected vertical and horizontal frame members. At least one of the vertical frame members includes a closed profile and a vertical channel extending a length thereof, and at least one of the horizontal frame members is a structural member having a closed profile that includes at least one T-slot channel and at least one recessed groove extending a length thereof. The adjustment assembly is arranged at a bottom of the frame structure and includes a threaded stud having a recess at a top-facing end thereof. The stud is threadedly received through an opening in a support block mounted at the bottom of the frame structure. The support block includes a cavity at an upper end thereof into which the top-facing end of the stud is arranged. The cavity of the support block is unobstructed from above to facilitate access to and rotation of the stud via a tool positioned into the recess, thereby facilitating adjustment of a height of the leveling foot.

In a feature of this aspect, the recess is a hexagonal recess.

In another feature of this aspect, the vertical channel is a V-shaped vertical channel. In another feature of this aspect, the stud is accessible from within the V-shaped vertical channel and outside of the closed profile.

In another feature of this aspect, the at least one of the vertical frame members includes a cutaway for receiving an end of one of the horizontal frame members. In another feature of this aspect, a bottom interior-facing surface of the channel is connected to the end of the horizontal frame member received within the cutaway. In another feature of this aspect, the connection between the bottom interior-facing surface of the channel and the end of the horizontal frame member is a weld connection.

In another feature of this aspect, each of the vertical frame members and the horizontal frame members includes at least one inset area extending the length thereof. In another feature of this aspect, the electronic equipment structure further includes a plurality of panels seated within the inset areas such that the panels do not protrude beyond a footprint defined by the frame structure.

In another feature of this aspect, at least one frame member of a pair of interconnected frame members of the frame structure includes one or more tabs that are received within a corresponding cutout of the other frame member of the pair of interconnected frame members.

In another feature of this aspect, a bottom end of the vertical channel is connected to a lower one of the horizontal frame members via a weld connection to facilitate transfer of an equipment load from the at least one vertical frame member, through the lower one of the horizontal frame members, and to the support block.

Broadly defined, the present invention according to another aspect relates to a method of installing an accessory part in an electronic equipment enclosure. The method includes: providing an electronic equipment enclosure having a frame structure that includes a plurality of interconnected vertical and horizontal frame members, wherein at least one of the horizontal frame members includes at least one T-slot channel and at least one recessed groove extending a length thereof, the at least one recessed groove including a row of mounting apertures arranged therein; providing an accessory part including a recessed area and an elongate opening arranged in the recessed area; positioning the accessory part such that the recessed area is aligned within the at least one recessed groove; and arranging a fastener through the elongate opening of the accessory part and a selected one of the mounting apertures of the at least one recessed groove such that the fastener does not protrude beyond an outward-facing surface of the accessory part.

In a feature of this aspect, the method further includes hooking a tab of the accessory part over a ledge of the at least one T-slot channel.

In another feature of this aspect, the method further includes adjusting a position of the accessory part relative to the frame structure by shifting a position of the fastener within the elongate opening of the accessory part.

In another feature of this aspect, the method further includes adjusting a position of the accessory part relative to the frame structure by removing the fastener from the selected one of the mounting apertures and arranging the fastener through a different one of the mounting apertures.

In another feature of this aspect, each mounting aperture includes a boss at an interior-facing side thereof. In another feature of this aspect, the fastener is a thread-forming fastener. In another feature of this aspect, the method further includes penetrating a coating of the boss at the selected one of the mounting apertures with the thread-forming fastener to establish metal-on-metal contact between the thread-forming fastener and the frame structure, thereby establishing an electrical bonding connection.

Broadly defined, the present invention according to another aspect relates to a method of adjusting a height of an electronic equipment enclosure. The method includes: providing an electronic equipment enclosure having a frame structure that includes a plurality of interconnected vertical and horizontal frame members, each of the vertical members having a closed profile and a channel extending a length thereof for providing access to an adjustment assembly of a leveling foot of the frame structure, wherein the adjustment assembly is positioned within the channel and outside of the closed profile, the adjustment assembly includes a stud having a recess at a top-facing surface thereof, and the stud is received through an opening in a support block mounted to the frame structure; positioning a tool within the recess of the stud from above the leveling foot; and rotating the stud using the tool to adjust a height of the leveling foot from above the leveling foot.

In a feature of this aspect, the recess is a hexagonal-shaped recess.

In another feature of this aspect, the channel is a V-shaped channel.

Further areas of applicability of the present invention will become apparent from the detailed description provided hereinafter. It should be understood that the detailed description and specific examples, while indicating preferred embodiment(s) of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
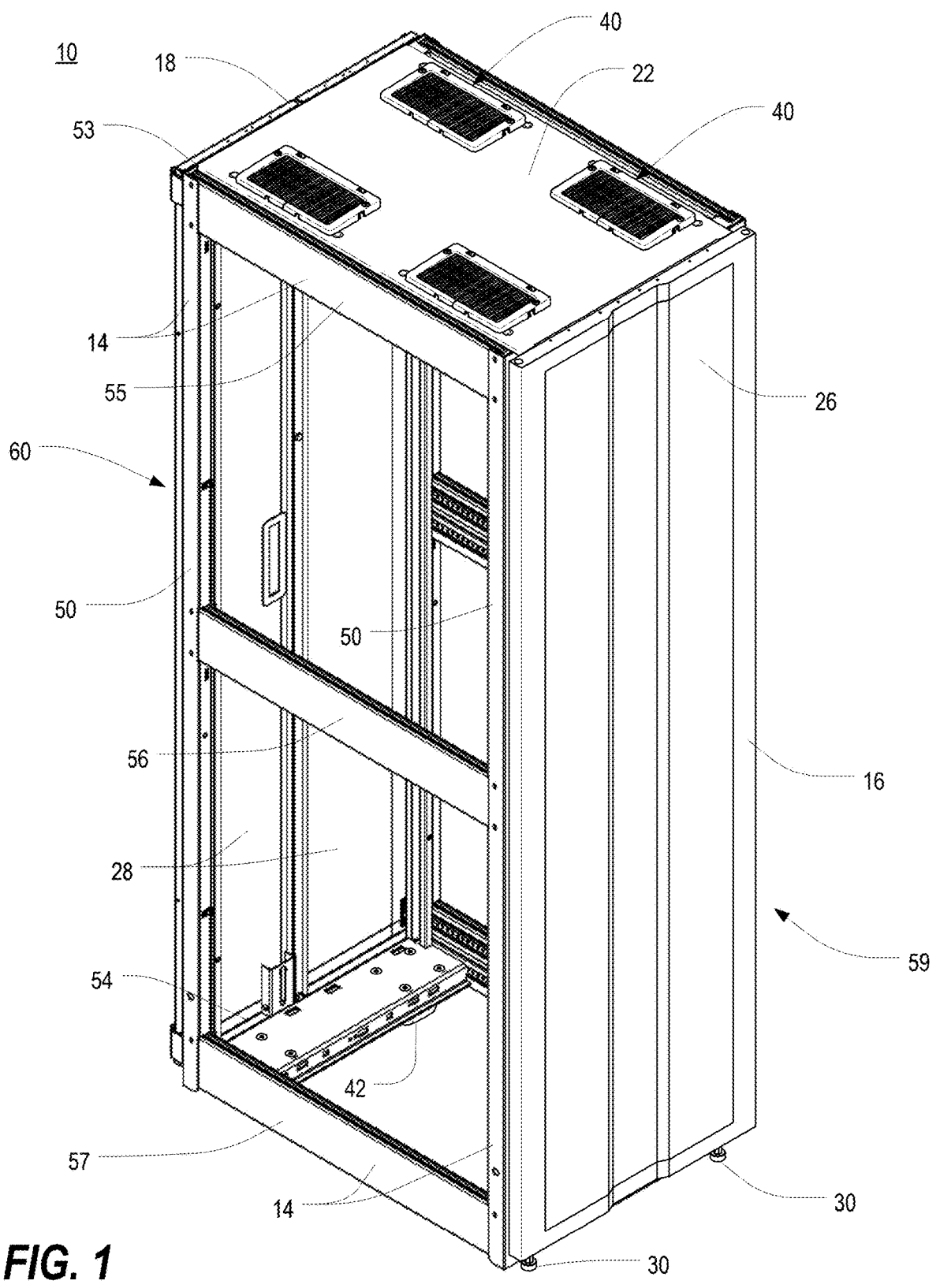
FIG. 1 is an isometric view of an electronic equipment enclosure having an improved frame in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Furthermore, an embodiment of the invention may incorporate only one or a plurality of the aspects of the invention disclosed herein; only one or a plurality of the features disclosed herein; or combination thereof. Moreover, many embodiments, including adaptations, variations, modifications, and equivalent arrangements, are implicitly disclosed herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention in any claim of a patent issuing here from, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the issued claim(s) rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term-differs in any way from any particular dictionary definition of such term, it is intended that the meaning of the term as understood by the Ordinary Artisan should prevail.

With regard solely to construction of any claim with respect to the United States, no claim element is to be interpreted under 35 U.S.C. 112(f) unless the explicit phrase "means for" or "step for" is actually used in such claim element, whereupon this statutory provision is intended to and should apply in the interpretation of such claim element. With regard to any method claim including a condition precedent step, such method requires the condition precedent to be met and the step to be performed at least once during performance of the claimed method.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Further, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 2:
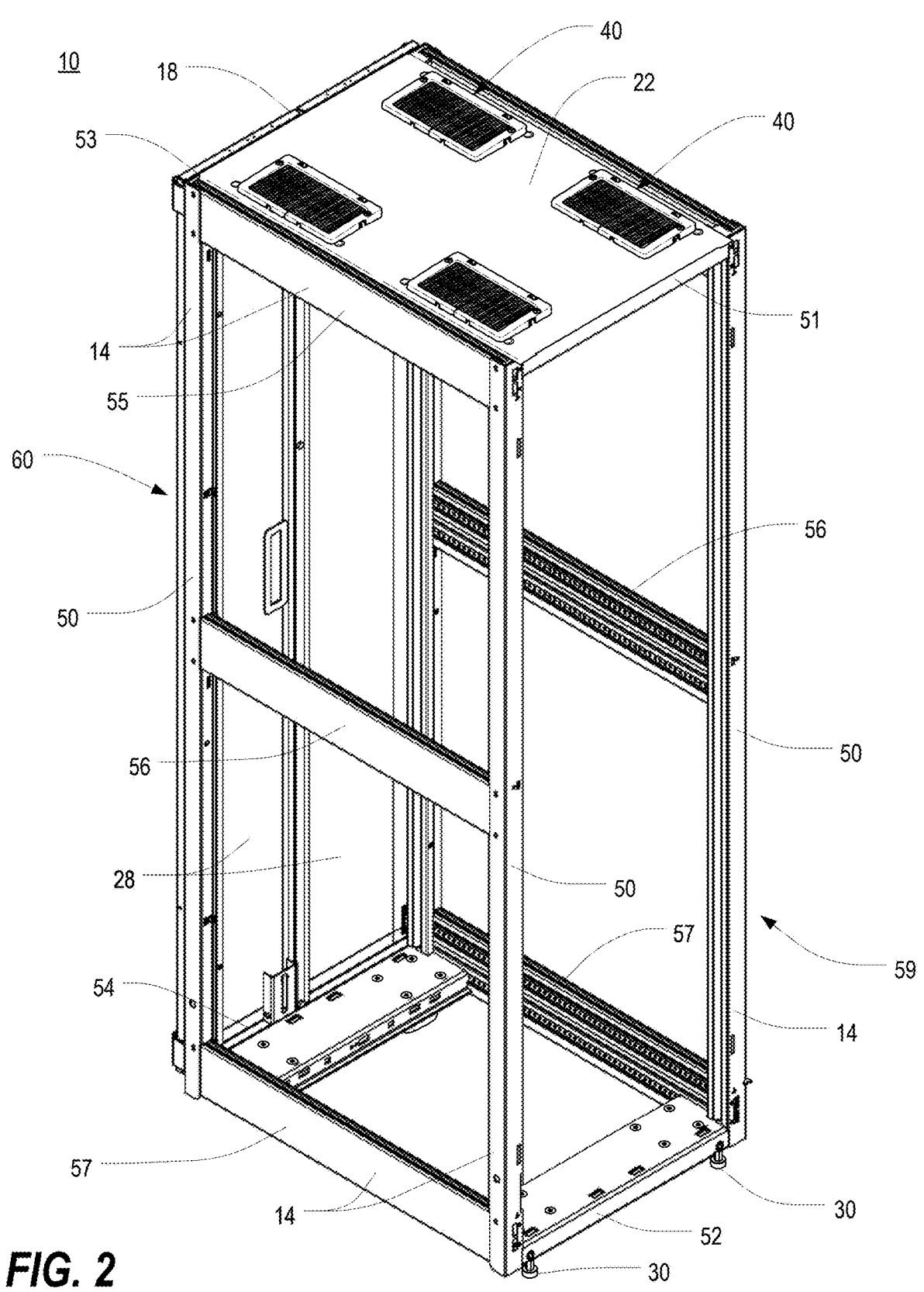
FIG. 2 is an isometric view of the electronic equipment enclosure of FIG. 1, shown with the front door removed.

FIG. 1 is an isometric view of an electronic equipment enclosure 10 having an improved frame in accordance with one or more preferred embodiments of the present invention, and FIG. 2 is an isometric view of the electronic equipment enclosure 10 of FIG. 1, shown with the front door 26 removed. As shown therein, the enclosure 10 includes a four-post frame structure 14 supporting a front panel assembly 16, a rear panel assembly 18, and a top panel assembly 22. Although not shown, the frame structure 14 may further support a pair of side panel assemblies, a bottom panel assembly, and/or other structures. In the illustrated embodiment, the front panel assembly 16 is implemented as a single hinged door 26, the rear panel assembly 18 is implemented as a pair of hinged doors 28, and the top panel assembly 22 includes a primary panel and a plurality of ports 40. However, it will be appreciated that various replacement components may be substituted for the components of the enclosure system, without departing from the scope of the present invention.

With reference to FIGS. 1 and 2, the four-post frame structure 14 is formed of a plurality of interconnected horizontal and vertical frame components. Four vertical frame members 50 represent the four upright posts of the frame structure 14. Each of the four vertical frame members 50 is depicted as having a closed profile, as will be discussed in greater detail below. It should be noted that, in some contemplated embodiments, some vertical members have a closed profile while others have an open profile. In such cases, it is further contemplated, for example, that front vertical frame components of the four-post frame structure have a closed profile and rear vertical frame components of the four-post frame structure have an open profile, or vice versa. In this regard, the frame structure 14 is adaptable to meet a variety of size and spatial requirements, such as for the purpose of extending a rear of the structure to accommodate a rear plenum space. Other arrangements and combinations of frame components utilizing a closed profile and frame components utilizing an open profile are likewise contemplated.

Horizontal side-to-side members 51,52,53,54, which are also referred to herein as "laterals," connect upper and lower ends of the four vertical frame members 50 together to form front and rear frames 59,60. In particular, upper and lower front laterals 51,52 connect two of the four vertical frame members 50 together to form the front frame 59, and upper and lower rear laterals 53,54 connect the other two of the four vertical frame members 50 together to form the rear frame 60. Horizontal front-to-back members 55,56,57, which are also referred to herein as "slides," connect the front and rear frames 59,60 together. The frame structure 14 of FIGS. 1 and 2 includes six slides 55,56,57: upper slides 55 that connect the front and rear frames 59,60 together at upper ends thereof; middle slides 56 that connect the front and rear frames 59,60 at midsections thereof; and lower slides 57 that connect the front and rear frames 59,60 together at lower ends thereof. Although six slides 55,56,57 are used in the frame structure 14 of FIGS. 1 and 2, it is contemplated that more or fewer slides can be used without departing from the scope of the present invention. It is contemplated that the slides 55,56,57 can be used as mounting rails to secure accessories or other components to the frame structure 14.

Figure 3:
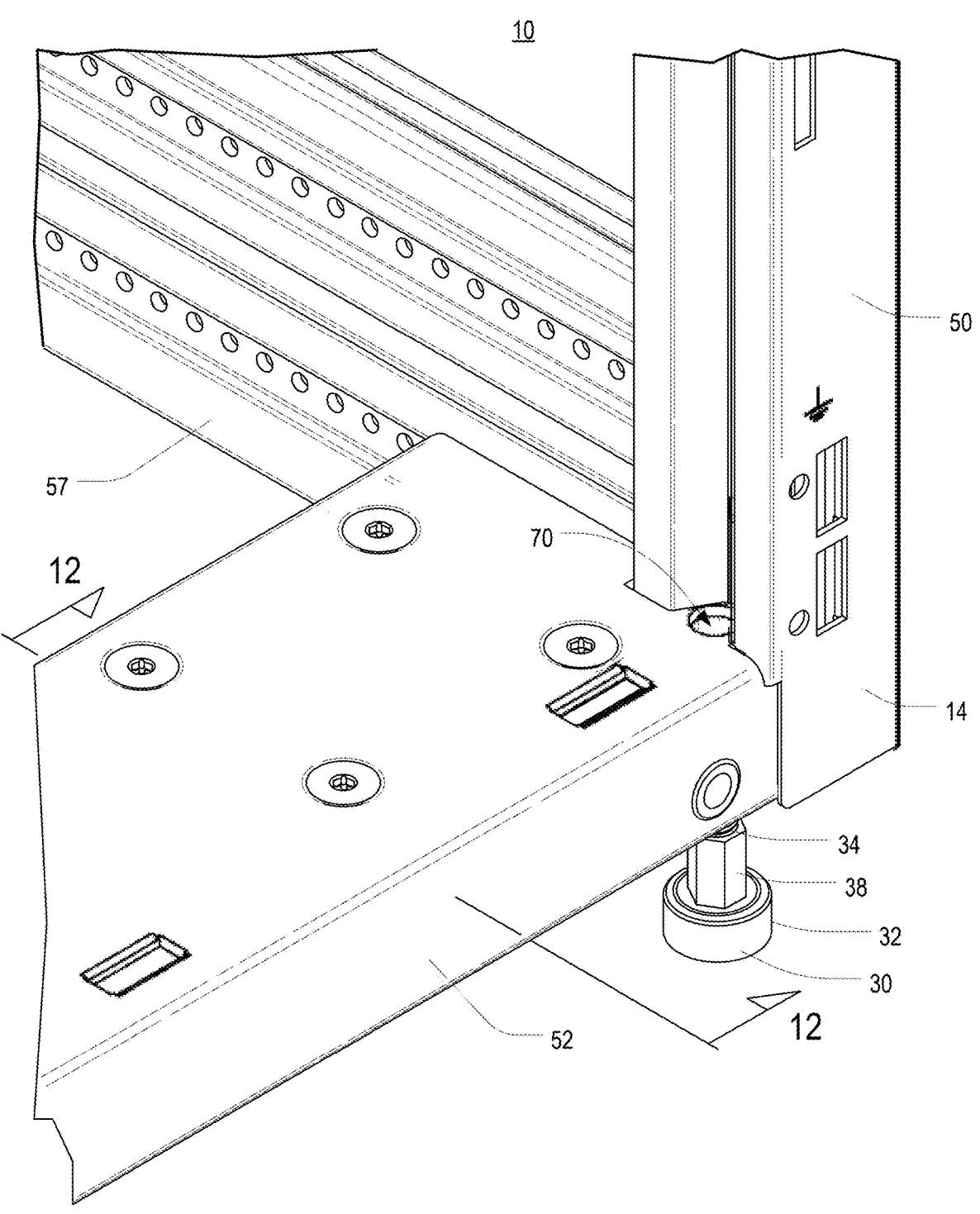
FIG. 3 is an enlarged fragmentary isometric view of a corner of the electronic equipment enclosure of FIG. 2.
Figure 4:
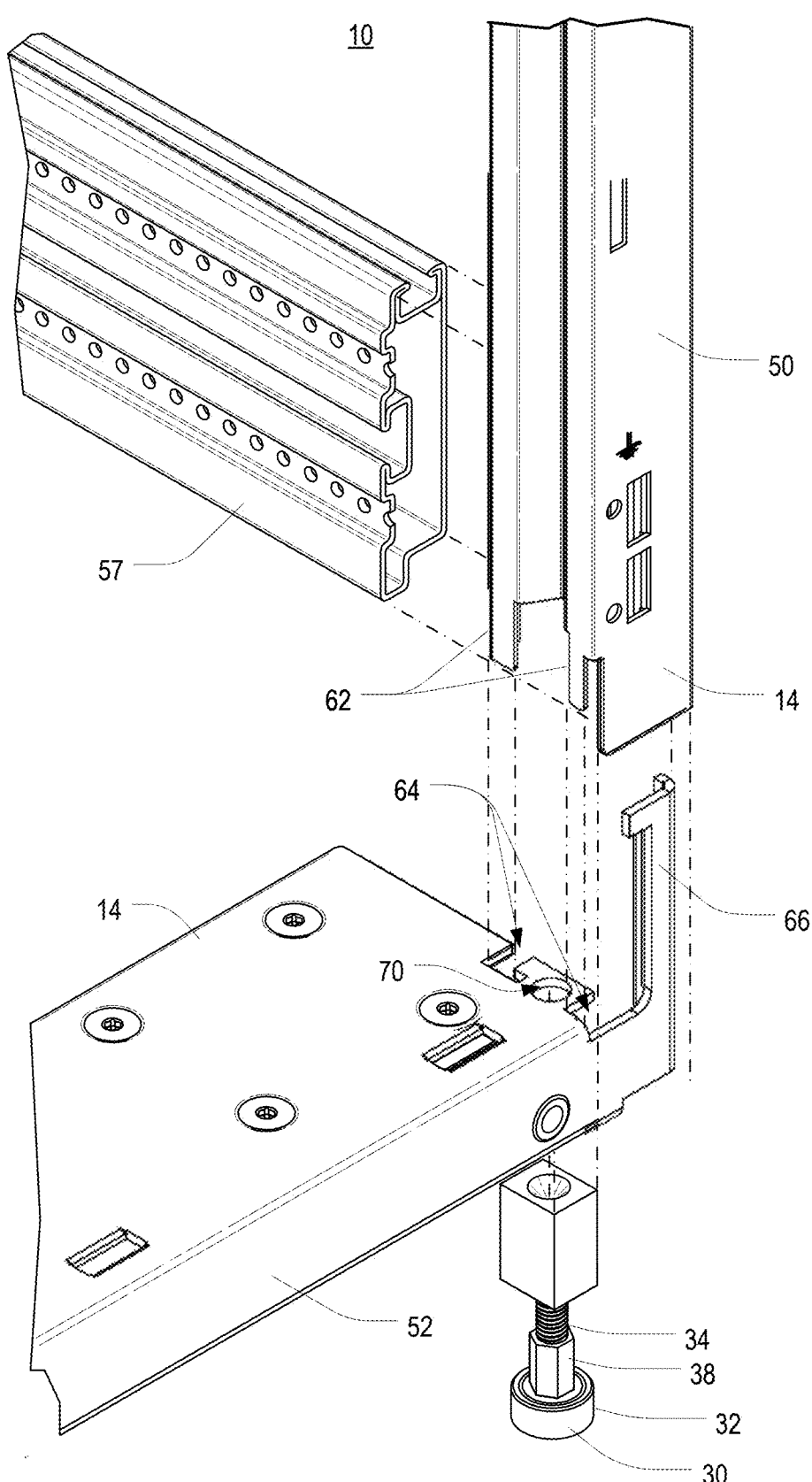
FIG. 4 is an exploded fragmentary isometric view of the corner of the electronic equipment enclosure of FIG. 3.

FIG. 3 is an enlarged fragmentary isometric view of a corner of the electronic equipment enclosure 10 of FIG. 2, and FIG. 4 is an exploded fragmentary isometric view of the corner of the electronic equipment enclosure 10 of FIG. 3. FIGS. 3 and 4 depict a corner of the electronic equipment enclosure 10 where one of the vertical frame members 50 interconnects with the lower front lateral 52 and one of the lower slides 57. To facilitate interconnection of the frame components, it is contemplated that one or more of the components include cutouts, cutaways, or attachment features so that the components can be aligned and assembled.

As shown in FIG. 4, the vertical frame member 50 includes a plurality of downwardly-extending tabs 62 of differing widths, each of which is received within a corresponding cutout 64 in the end of the lower front lateral 52. Additionally, the lower front lateral 52 includes an extension arm 66 that protrudes upwardly from an end there of and is received against an inner sidewall of the vertical frame member 50. Still further, the vertical frame member 50 includes a lower cutout or cutaway 69 (perhaps best seen in FIG. 15) for receiving the end of the lower slide 57. When assembled, as shown in FIG. 3, the frame components that form the lower corner include a variety of structural features that overlap or adjoin one another. In this regard, the frame structure 14 is imparted with enhanced strength, particularly when connection points among the frame components are welded together. Welding together of overlapping or adjoining components of the frame structure 14 can provide for enhanced strength and durability across the length, width, and depth axes. It is contemplated that the other lower corners, as well as the upper corners, of the frame structure 14 include the same or similar features as those shown and/or described in connection with FIGS. 3 and 4.

With reference to FIGS. 1 and 2, similar features are shown with respect to other interconnections among components of the frame structure 14. For example (and as perhaps best seen in FIG. 15), vertical frame members 50 include upper cutouts or cutaways 67 to receive ends of the upper slides 55, midsection cutouts or cutaways 68 to receive ends of the middle slides 56, and lower cutouts or cutaways 69 to receive ends of the lower slides 57. Additionally, although not visible in the views of FIGS. 1 and 2, upper laterals 51,53 of the frame structure 14 include extension features that overlap with portions of the vertical frame members 50. Components of the frame structure 14 can be joined with fasteners, with welds, or by a combination of fasteners and welds.

As further shown in FIGS. 3 and 4, the electronic equipment enclosure 10 further includes four leveling feet 30 disposed near the four bottom corners of the enclosure 10. Each leveling foot 30 is independently adjustable from above to facilitate leveling the enclosure 10, as will be explained in further detail below.

Figure 5:
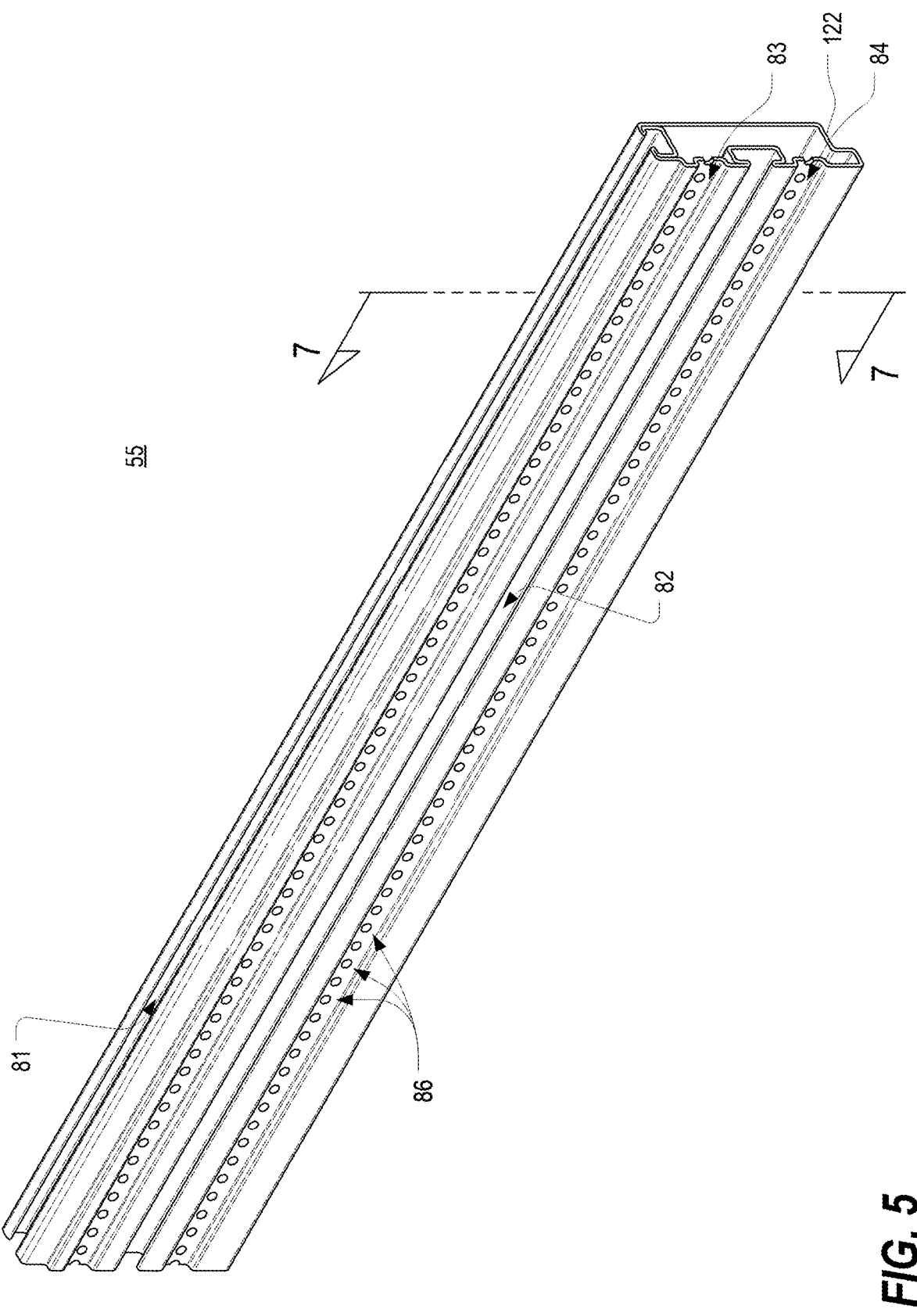
FIG. 5 is an isometric view of one of the slide-type front-to-back members of FIG. 2.

FIG. 5 is an isometric view of one of the slide-type front-to-back members 55 of FIG. 2. In at least some contemplated embodiments, the slides 55,56,57 of the frame structure 14 are structurally identical. Although the slide of FIG. 5 could feasibly be any of an upper slide 55, a middle slide 56, or a lower slide 57, the slide of FIG. 5 is identified herein as an upper slide 55 for purposes of the discussion that follows.

Figure 6:
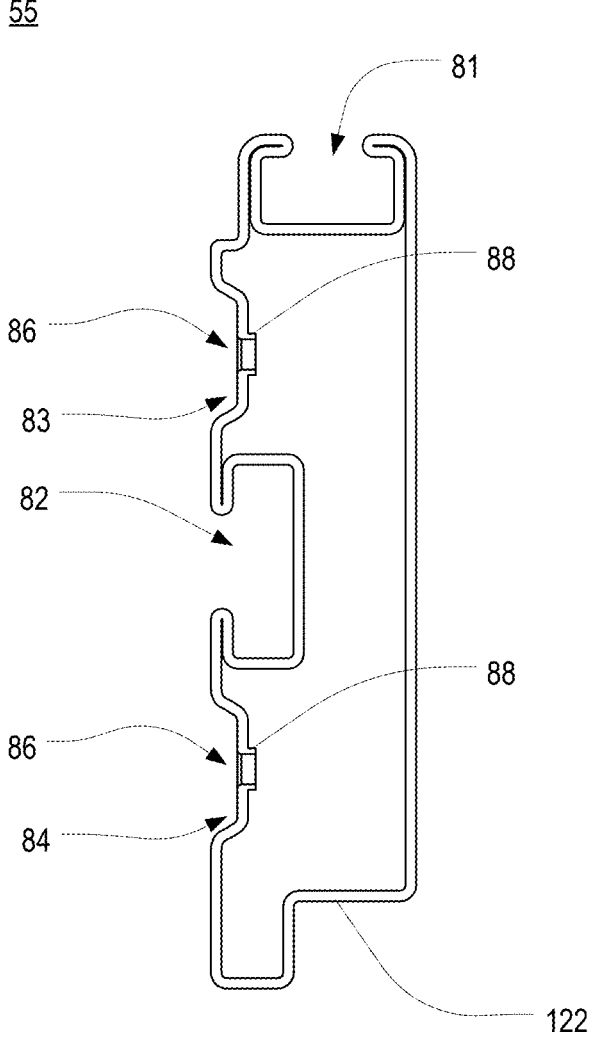
FIG. 6 is an end view of the slide-type front-to-back member of FIG. 5.
Figure 7:
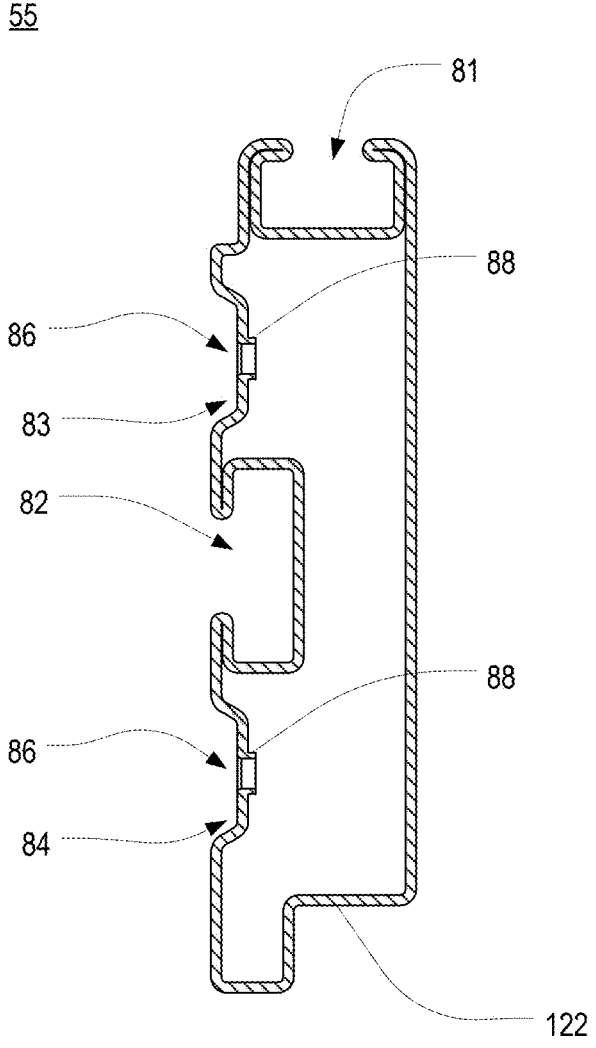
FIG. 7 is an end cross-sectional view of the slide-type front-to-back member of FIG. 5, taken along line 7-7.

As shown in FIG. 5, the slide 55 has a roll-formed closed profile that is generally rectangular in shape. In this regard, FIG. 6 is an end view of the slide-type front-to-back member 55 of FIG. 5, and FIG. 7 is an end cross-sectional view of the slide-type front-to-back member 55 of FIG. 6, taken along line 7-7. In contemplated embodiments, the slide 55 is formed of steel. As shown in FIGS. 5-7, the slide 55 includes a pair of T-slot channels 81,82 and a pair of recessed grooves 83,84 that extend along the length of the slide 55 on an inner face thereof. Each of the T-slot channels 81,82 and the recessed grooves 83,84 is capable of accommodating fasteners such that accessories or other structures may be mounted to the slide 55, as explained in greater detail below.

The slide 55 also includes a respective row of mounting apertures 86 arranged within each recessed groove 83,84. In at least some embodiments, the mounting apertures 86 are formed in connection with an extrusion process. In this regard, it is contemplated that the mounting apertures 86 may be extruded in an inward direction (i.e., toward the interior of the closed profile of the slide 55) so as to form an extruded boss 88 for increased engagement with a fastener positioned through the aperture 86. The mounting apertures 86 can be shaped to receive thread forming or thread cutting fasteners. In this regard, it is contemplated that the thread forming or thread cutting fasteners can provide an electrical bonding pathway for electrically conductive accessories or structures that are mounted to the frame structure 14. In at least some embodiments, the mounting apertures 86 are evenly spaced from one another at approximately 12.5 mm intervals (measured from aperture center to aperture center), which is half of an accepted industry standard for cabinet depth increments (i.e., 25 mm).

Figure 8A:
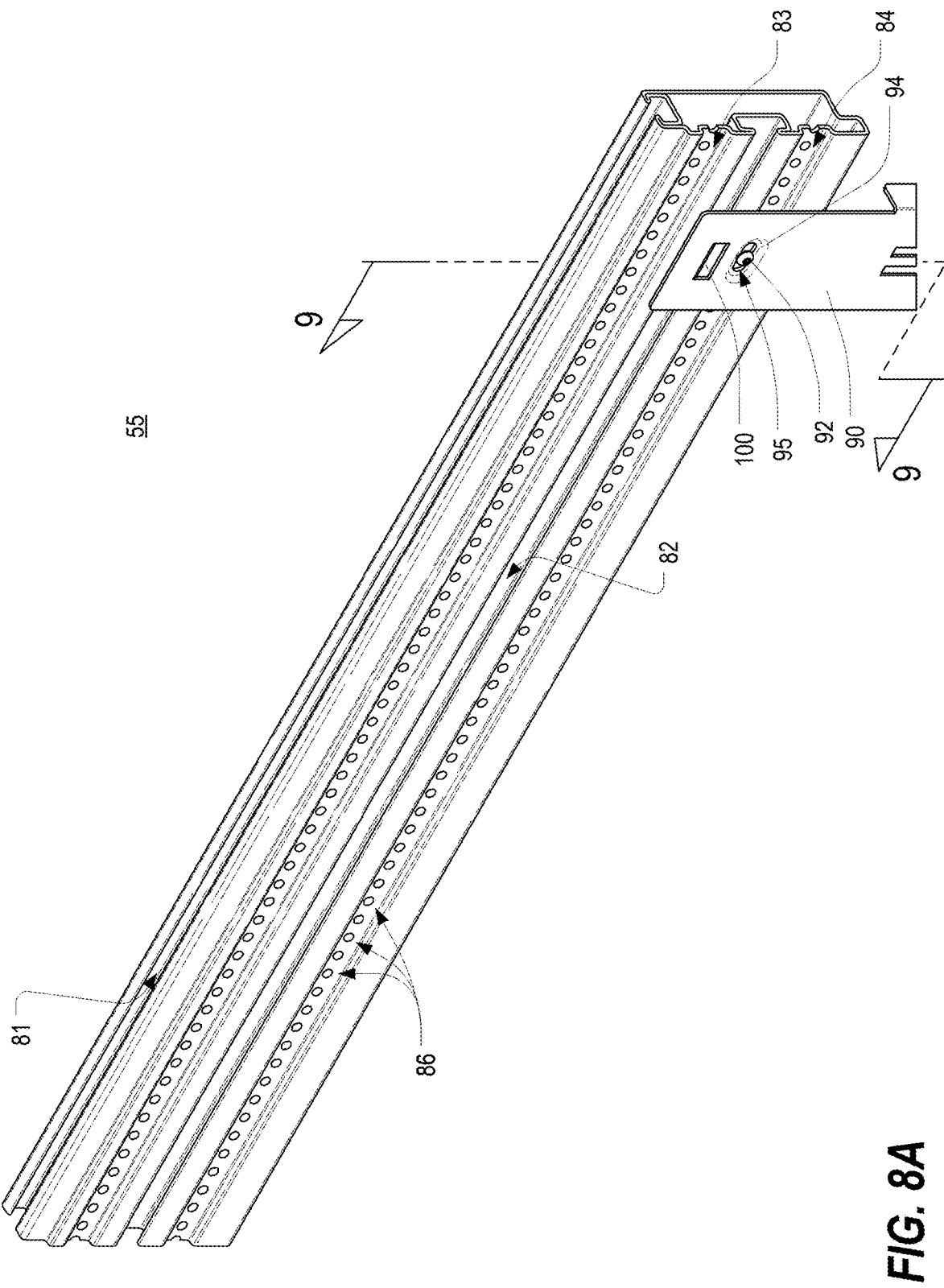
FIGS. 8A-8C are fragmentary isometric views of the slide-type front-to-back member of FIG. 5, shown with an accessory part mounted thereon.
Figure 8B:
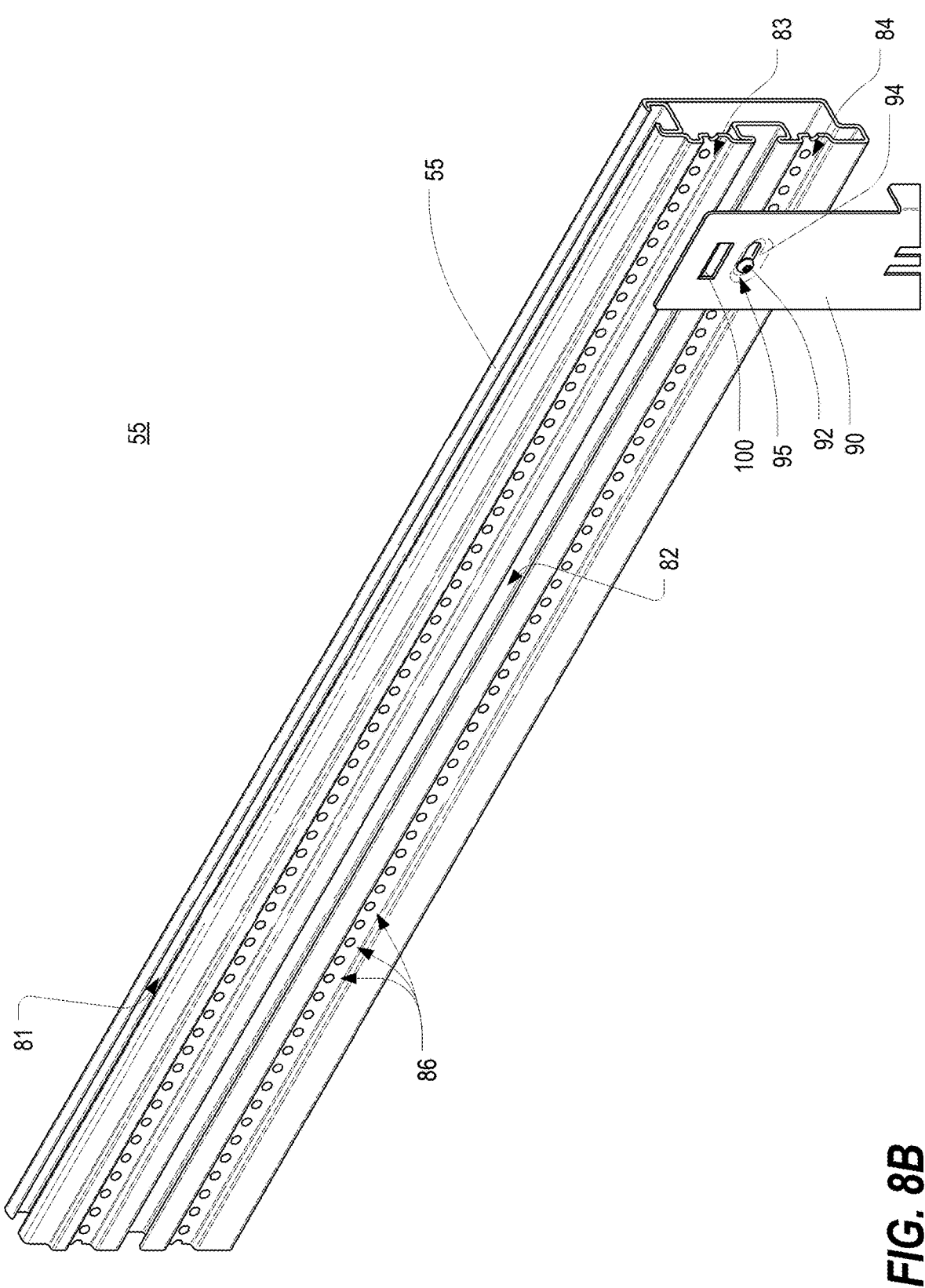
Figure 8C:
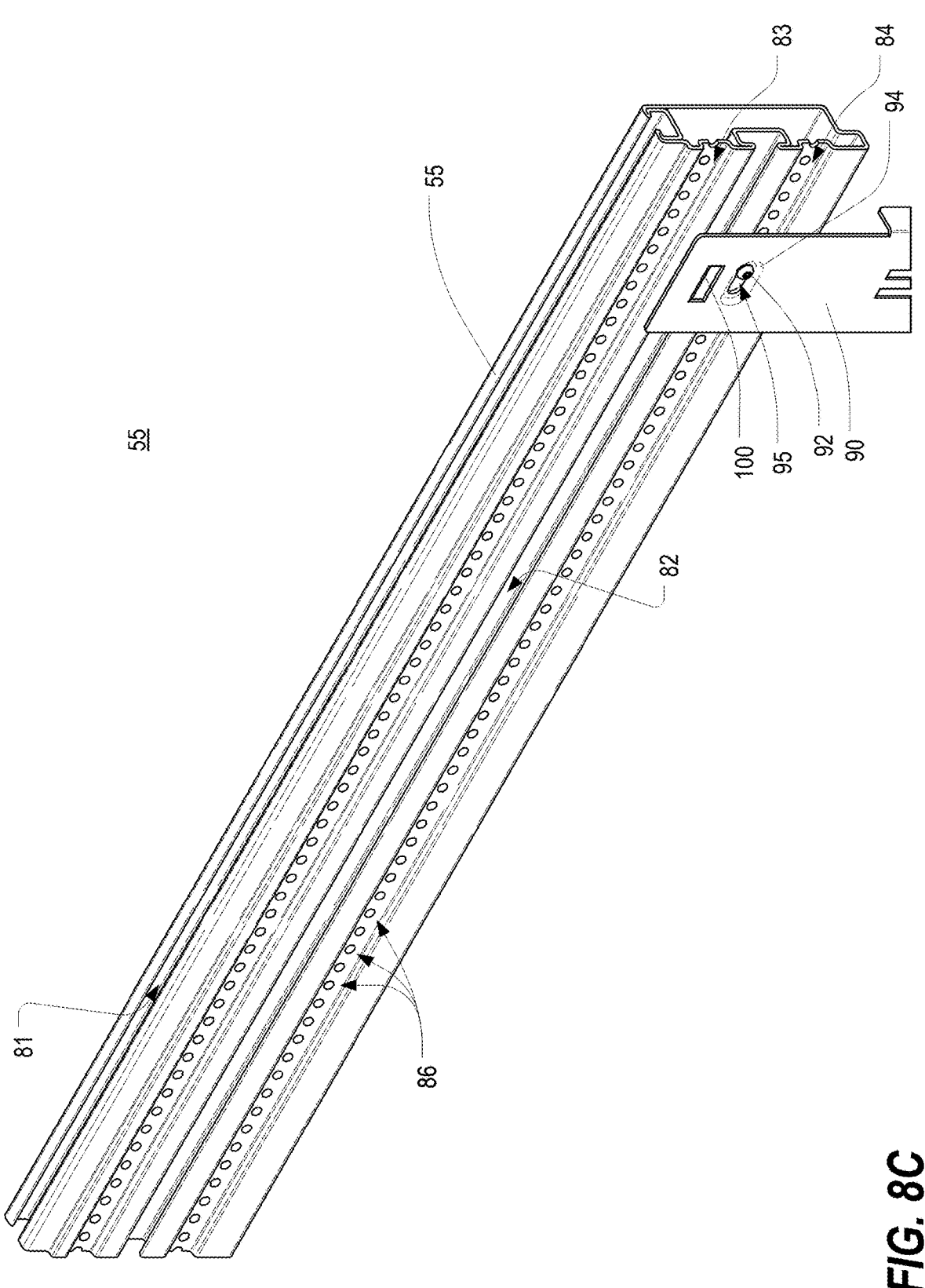
Figure 9:
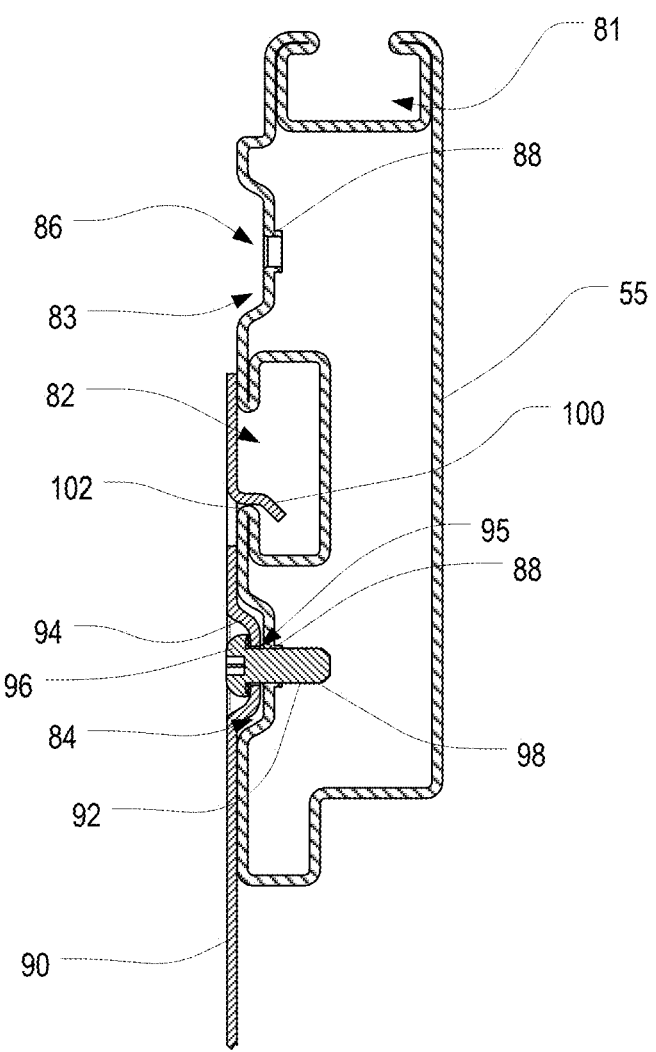
FIG. 9 is a fragmentary end cross-sectional view of the slide-type front-to-back member and accessory part of FIG. 8A, taken along line 9-9.

FIG. 8A is a fragmentary isometric view of the slide-type front-to-back member 55 of FIG. 5, shown with an accessory part 90 mounted thereon, and FIG. 9 is a fragmentary end cross-sectional view of the slide-type front-to-back member 55 and accessory part 90 of FIG. 8A, taken along line 9-9. As shown in FIGS. 8A and 9, accessories and other structures are mountable to the slide 55 at either (or both) of the pair of recessed grooves 83,84 with a separate fastener 92, such as a mounting screw. Although two recessed grooves 83,84 are shown in the embodiment of FIGS. 1-9, it is contemplated that the slide 55 may include more or fewer recessed grooves. In at least some embodiments, it is contemplated that an accessory part 90 or other structure to be mounted to the slide 55 may itself include a recessed area 94, which, when aligned within one of the recessed grooves 83,84 of the slide 55, will help self-align the accessory part 90 into a mounting position. Additionally, the accessory part 90 may include an alignment hook or tab 100 that is received over or against one of the ledges 102 of one of the T-slot channels 82 to help align the part 90 properly. In the illustrated embodiment, the alignment tab 100 is produced by punching through the accessory part 90, but such a tab may be produced in other ways as well. The fastener 92 passes through a slotted aperture 95 within the recessed area 94 and through one of the mounting apertures 86 of the slide 55. When tightened, the head 96 of the fastener 92 is seated within the recessed area 94 of the accessory part 90. In this regard, it is contemplated that the fastener head 96 can be positioned so as not to protrude beyond the face of the accessory part 90 and thus not interfere with other equipment mounted to the accessory part 90 or to the frame structure 14.

With further reference to FIGS. 8A and 9, the extruded boss 88 at the interior of the closed profile receives the shaft 98 of the fastener and facilitates increased engagement between the slide 55 and the fastener 92. Where the fastener is a thread forming or thread cutting screw, it is contemplated that the fastener 92 can cut through a coating on the slide 55 to establish an electrical bonding connection from the slide 55, through the fastener 92, and to the accessory part 90. In accordance with embodiments where the aperture 95 within the recessed area 94 is slotted or elongated, it is contemplated that the accessory part 90 is adjustable along the slide 55 within a range defined by the length of the slotted aperture 95, and at least within a range that reaches or exceeds a distance between adjacent mounting apertures 86 of the slide 55. This is illustrated in FIGS. 8B and 8C, which are fragmentary isometric views of the slide-type front-to-back member 55 of FIG. 5, shown with the accessory part 90 shifted sideways from the mounting position shown in FIG. 8A. Furthermore, such side-to-side adjustability within a range defined by the slotted aperture 95 facilitates infinite adjustability within a range defined by the length of the slide 55 when it is considered that the accessory part 90 is mountable to any selected one of the row of mounting apertures 86.

Figure 10:
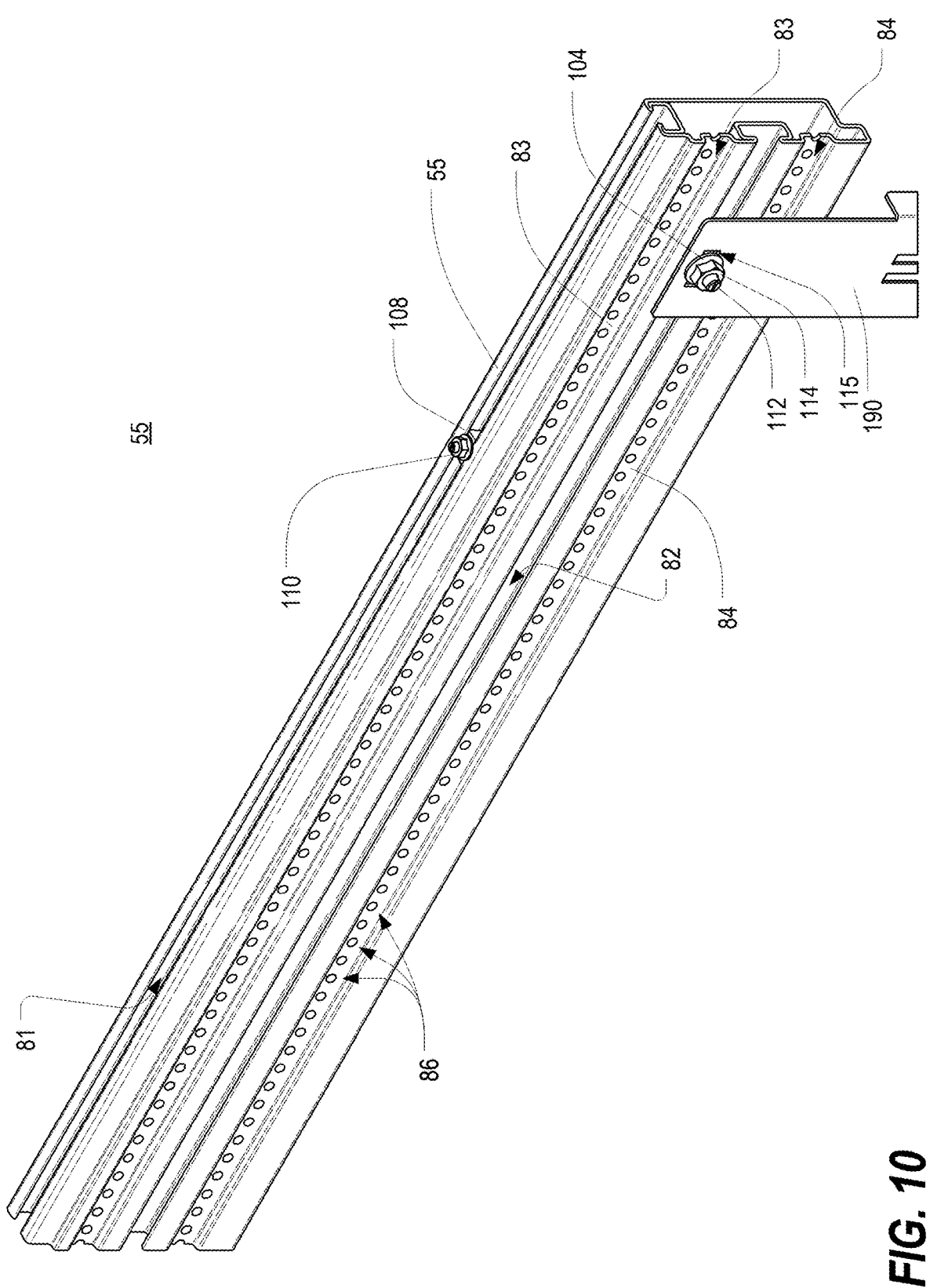
FIG. 10 is a fragmentary isometric view of the slide-type front-to-back member of FIG. 5, shown with a different accessory part mounted thereon.
Figure 11:
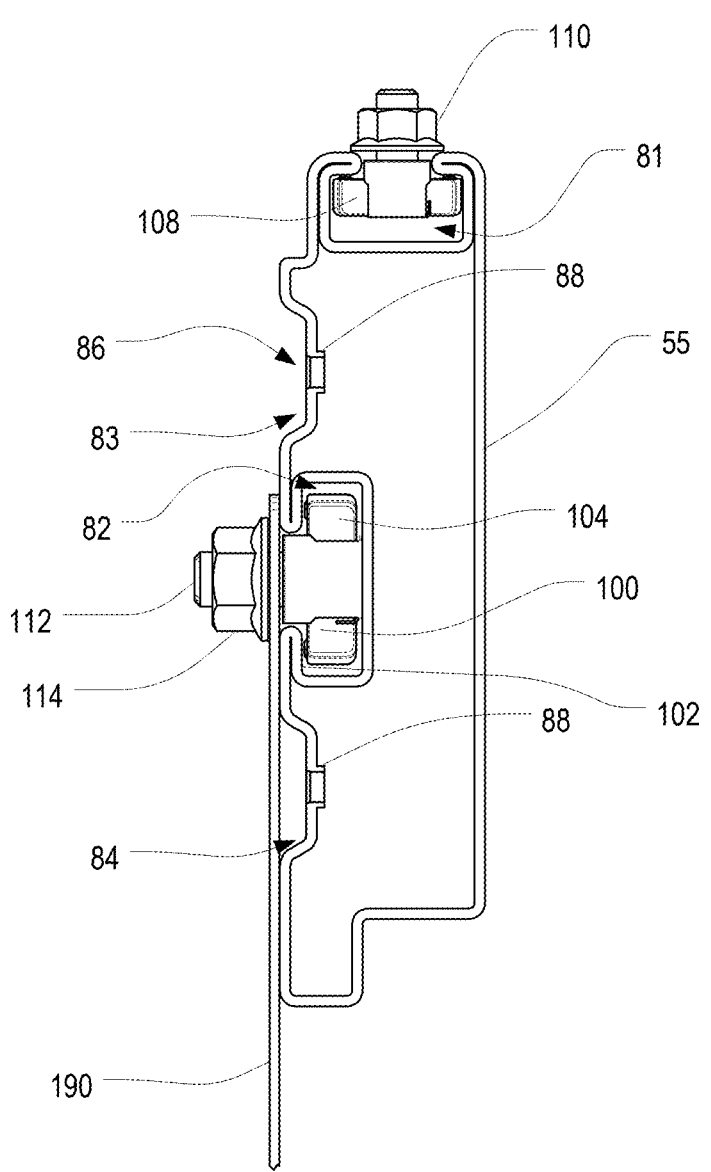
FIG. 11 is a fragmentary end view of the slide-type front-to-back member and accessory part of FIG. 10.

FIG. 10 is a fragmentary isometric view of the slide-type front-to-back member 55 of FIG. 5, shown with a different accessory part 190 mounted thereon, and FIG. 11 is a fragmentary end view of the slide-type front-to-back member 55 and accessory part 190 of FIG. 10. As shown in FIGS. 10 and 11, the slide 55 includes T-slot channels 81,82 arranged at a top-facing surface thereof and an interior-facing side surface thereof. It is contemplated that the slide 55 may include more or fewer T-slot channels as might be desired. Each of the T-slot channels 81,82 is adapted to receive nuts, bolts, or other mounting hardware fasteners such as those described in commonly-assigned U.S. Provisional Patent Application Ser. No. 63/125,489 (the "'489 application"), which is incorporated herein by reference. Mounting fasteners can be installed in the T-slot channels 81,82 in the manner described in the '489 application, and it is contemplated that fasteners are maneuverable within the T-slot channels 81,82 to facilitate infinite end-to-end adjustability (front-to-back in the enclosure 10) of equipment mounting rails and other accessory parts mounted to the slide 55 within a range defined by the length of the slide 55.

With reference to FIGS. 10 and 11, a bolt fastener 108 having a nut 110 secured thereto is shown positioned in the top-facing T-slot channel 81. The head of the bolt fastener 108 is received within the T-slot channel 81 and is maneuverable therein to adjust the position of the bolt fastener 108 when the nut 110 is not tightened against the slide 55. Although not shown, it is contemplated that the top-facing T-slot channel 81 can be used to provide attachment points for securement of a variety of different accessories or other structures to the slide 55 including, but not limited to, overhead cable pathways, aisle containment systems, and baying hardware for connecting separate enclosures. Also, it will be apparent that other types of accessories might be more suitable or commonly used with middle and lower slides 56,57.

With further reference to FIGS. 10 and 11, the accessory 190 is attached to the slide 55 via a bolt fastener 104. The illustrated bolt fastener 104 is positioned in the interior-facing T-slot channel 82, with the shaft 112 of fastener 104 arranged to extend outwardly from the T-slot channel 82 and through a slotted aperture 115 of the accessory part 190. A nut 114 is secured to the end of the shaft 112 and is tightened against the accessory part 190 to help secure the accessory part 190 to the slide 55. When the nut 114 is only loosely attached, the bolt fastener 104 is maneuverable within the T-slot channel 82 to facilitate infinite end-to-end adjustability (front-to-back in the enclosure 10) of the accessory part 190 within a range defined by the length of the slide 55. Further adjustability of the accessory part 190 is supported by the slotted aperture 115 in the accessory part 190. It is contemplated that the interior-facing T-slot channel 82 can be used to provide attachment points for securement of a variety of different accessories or other structures including, but not limited to, vertical equipment mounting rails.

Figure 12:
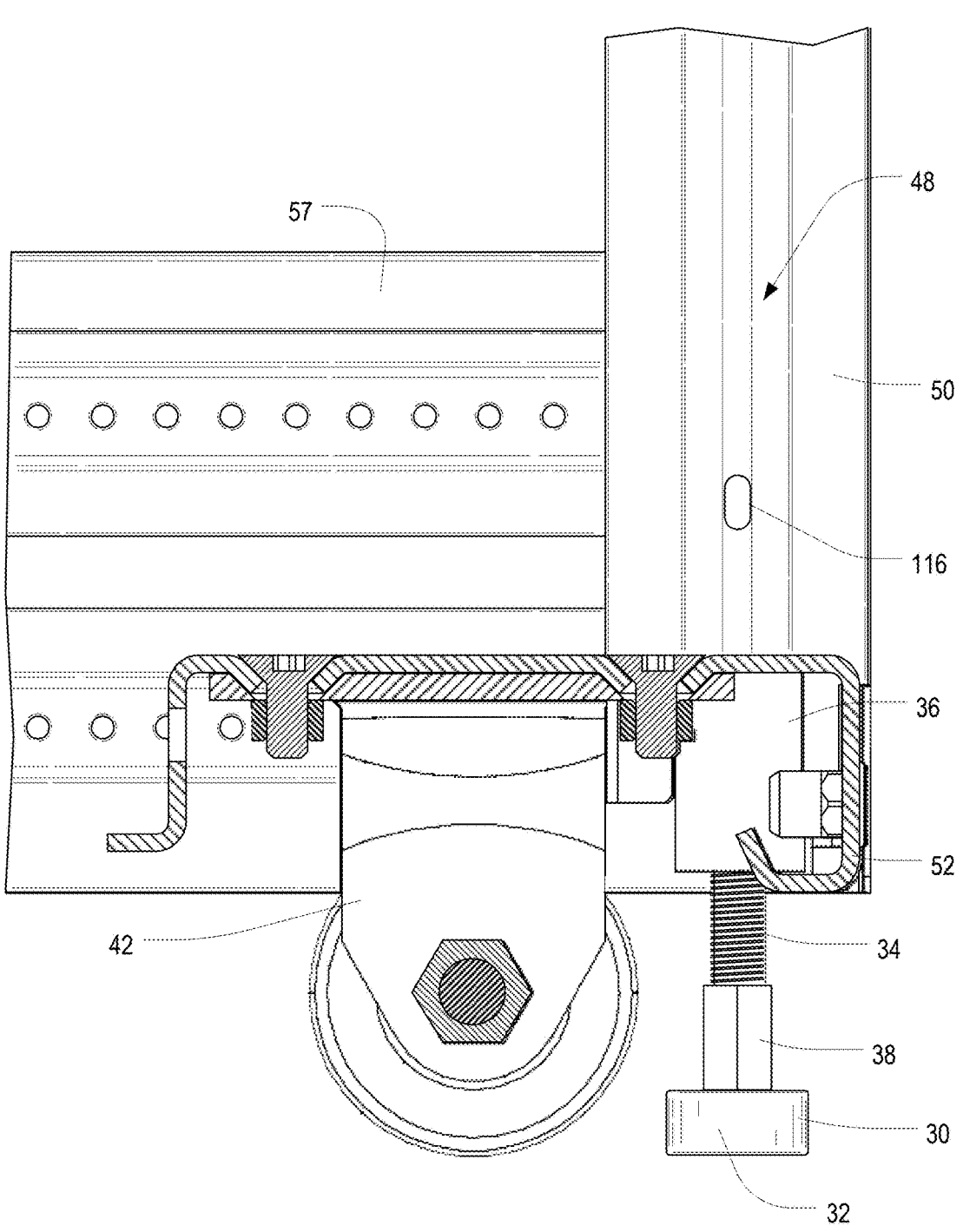
FIG. 12 is a fragmentary left side cross-sectional view of the corner of the electronic equipment enclosure of FIG. 3, taken along line 12-12.
Figure 13:
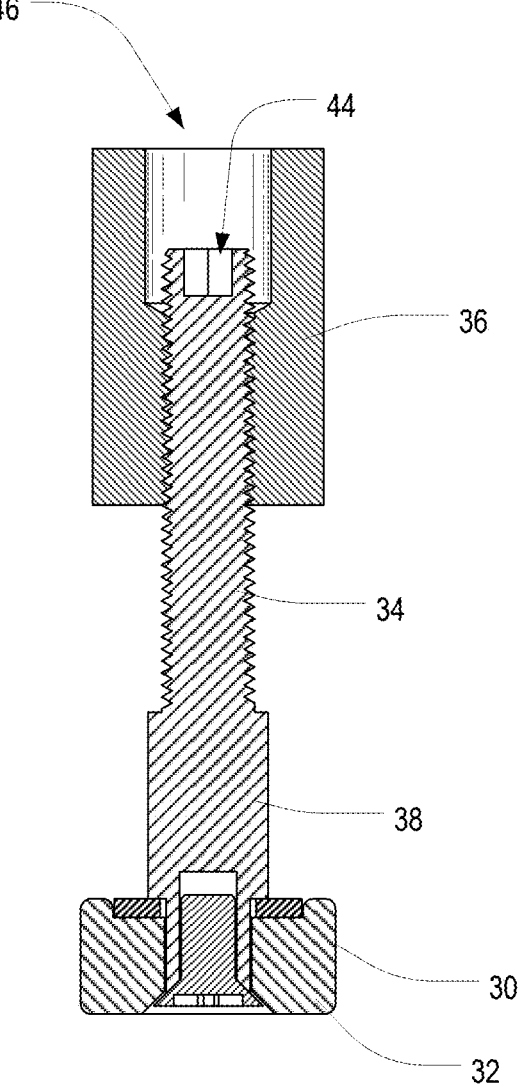
FIG. 13 is a left side cross-sectional view of the leveling foot of FIG. 12.
Figure 14:
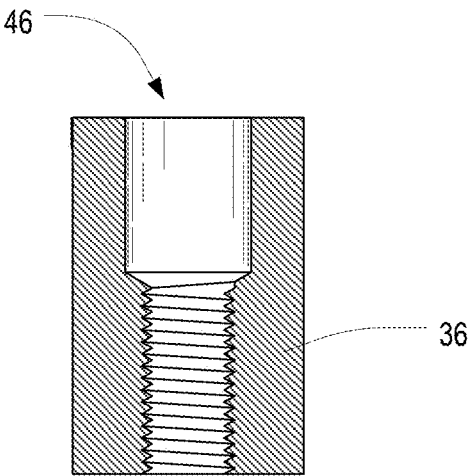
FIG. 14 is an exploded left side cross-sectional view of the leveling foot of FIG. 13.
Figure 14:
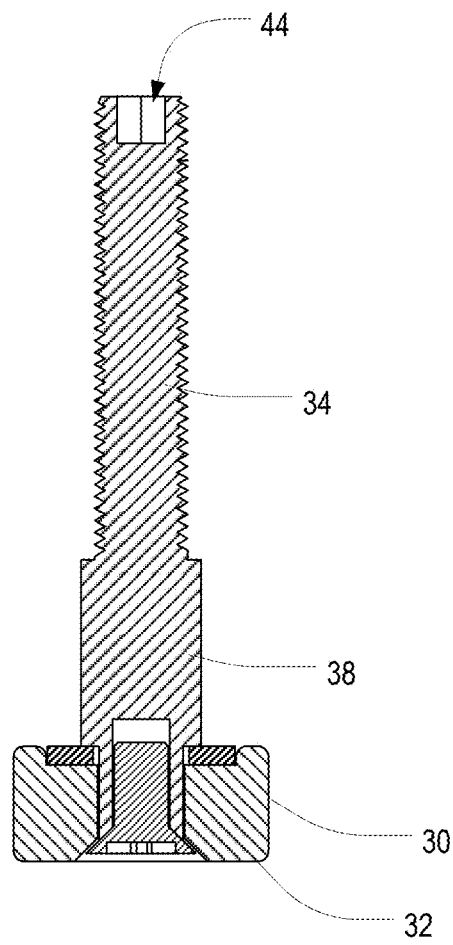

FIG. 12 is a fragmentary left side cross-sectional view of the corner of the electronic equipment enclosure 10 of FIG. 3, taken along line 12-12. As shown in FIG. 12, the leveling feet 30 at the base of the enclosure 10 operate in conjunction with a set of caster assemblies 42 (one of which is shown in FIG. 12) to support the enclosure 10 on a floor surface. FIG. 13 is a left side cross-sectional view of the leveling foot 30 of FIG. 12, and FIG. 14 is an exploded left side cross-sectional view of the leveling foot 30 of FIG. 13. Each leveling foot 30 includes a pad 32, a threaded stud 34, a support block 36 for receiving the threaded stud 34, and a large hexagonal head 38 that can be used to screw the stud 34 into or out of the support block 36. The support block 36 is attached to the frame structure 14 of the enclosure 10 such that the weight of the enclosure 10 is reliably transferred to the support blocks 36. It is contemplated that the feet 30 may be adjusted by rotating the hexagonal head 38, by hand or using a wrench, such that the bottom of the pad 32 rests firmly on the floor. Because each leveling foot 30 may be adjusted individually, further adjustment may be necessary in order to level the enclosure 10, both side-to-side and front-to-back, if the floor is uneven.

In addition, however, it is contemplated that the feet 30 may be adjusted and leveled from above the support block 36. As shown in FIGS. 13 and 14, the stud 34 includes a hexagonal recess 44 at a distal end thereof. When the stud 34 is screwed into the support block 36, the recess 44 at the distal end of the stud 34 is positioned within a larger cavity 46 at an upper end of the support block 36. Access to the cavity 46 is provided by an opening 70 in the top of the lateral member 52 (visible in FIGS. 3 and 4). By accessing the recess 44 of the stud 34 through the cavity 46 in the support block 36 and the opening 70 in the lateral member 52, the foot 30 can be adjusted or leveled by rotating the stud 34 using a hex-shaped tool or wrench fitted into the recess 44 from above the lateral member 52.

Figure 15:
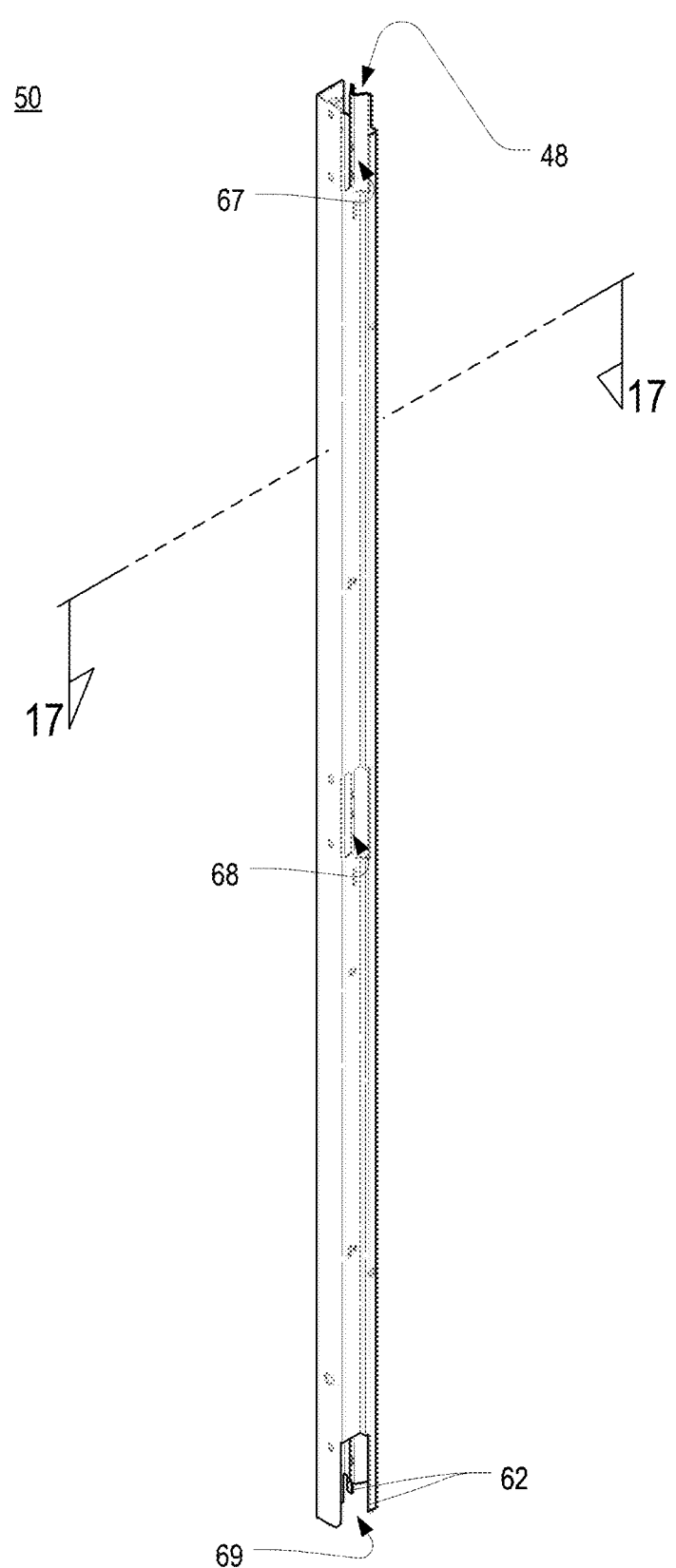
FIG. 15 is a rear isometric view of the vertical frame member of FIG. 3, shown in isolation.
Figure 16:
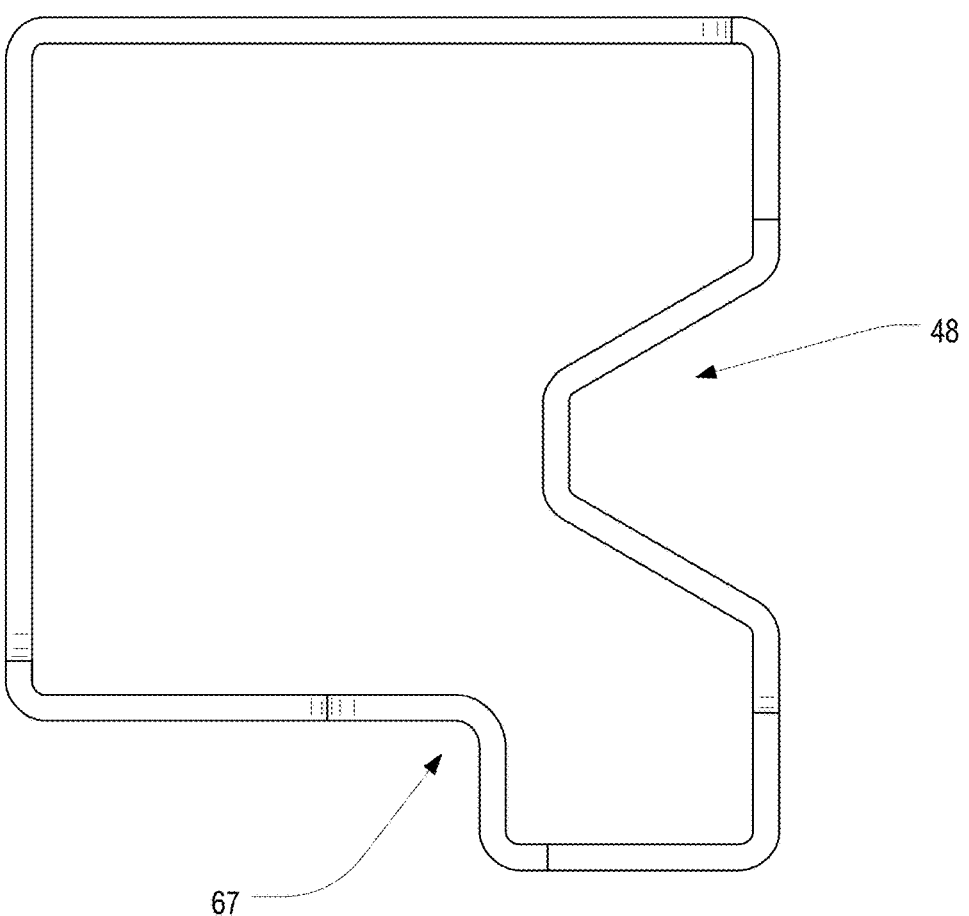
FIG. 16 is a top end view of the vertical frame member of FIG. 15.
Figure 17:
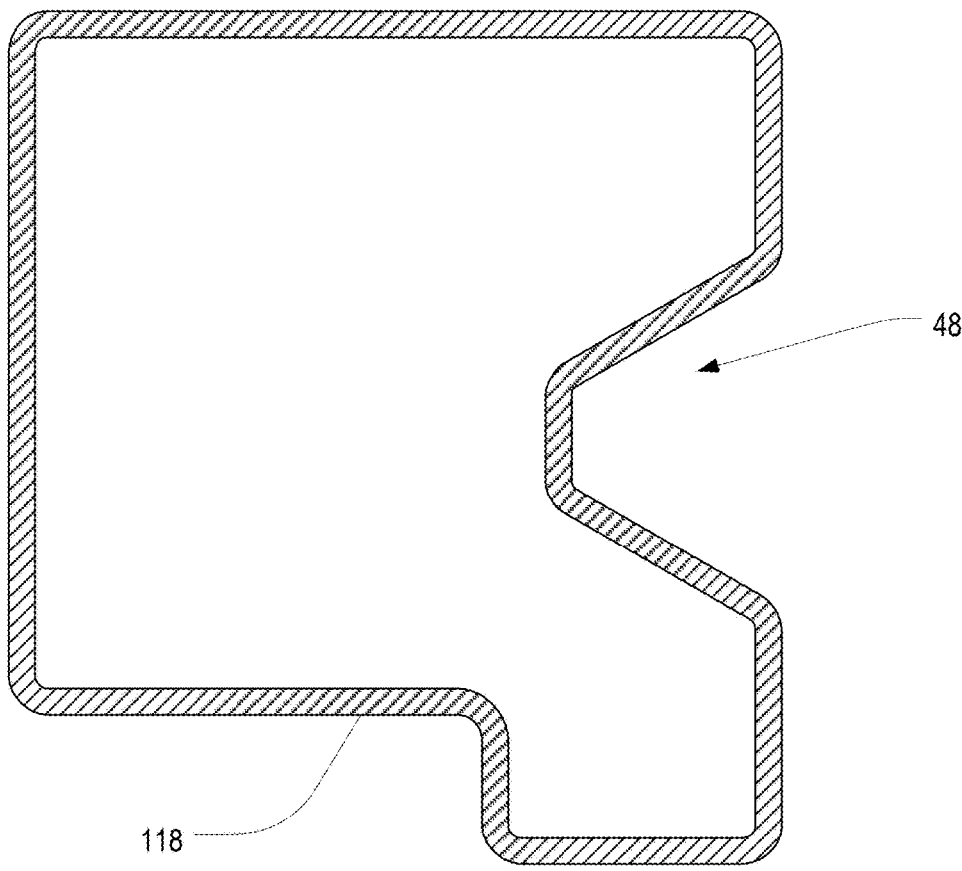
FIG. 17 is a top end cross-sectional view of the vertical frame member of FIG. 15, taken along line 17-17.

Notably, access to each leveling foot 30 from above the support block 36 is enabled by the shape and profile of the vertical frame members 50 of the frame structure 14. In this regard, FIG. 15 is a rear isometric view of the vertical frame member 50 of FIG. 3 (shown in isolation), FIG. 16 is a top end view of the vertical frame member 50 of FIG. 15, and FIG. 17 is a top end cross-sectional view of the vertical frame member 50 of FIG. 15. As shown in FIGS. 15-17, the vertical frame member 50 has a roll-formed closed profile with a V-shaped channel 48 arranged along one side. When arranged as part of the frame structure 14, it is contemplated that the vertical frame members 50 are oriented so that the V-shaped channels 48 of the front frame 59 open toward one another and the V-shaped channels 48 of the rear frame 60 open toward one another. In this arrangement, the opening 70 in the lateral member 52 and the cavity 46 at the upper end of the support block 36 are positioned within the V-shaped channel 48 and outside of the closed profiled of the vertical frame member 50. With the opening 70 and cavity 46 positioned outside the closed profile of the vertical frame member 50, the top of the support block 36 is accessible to enable leveling of the feet and facilitate vertical adjustment of the frame structure 14.

It is contemplated that vertical frame members 50 of the frame structure 14 may be structurally identical except that the left side vertical frame members 50 may be mirror images of the right side vertical frame members 50. In addition to providing access to the top of the support block 36, the vertical frame members 50 also impart structural advantages. For example, it is contemplated that the bottom-facing edge of the V-shaped channel 48 can transfer the vertical equipment load from the vertical frame members 50 of the frame structure 14 directly through a top plate of the lower lateral member 52 to the support blocks 36. Additionally, with reference to FIG. 12, it is contemplated that a bottom interior-facing surface of the V-shaped channel 48 can be welded or otherwise connected directly to the lower slide 57 at a lower attachment location 116. This connection is possible because of the lower cutout or cutaway 69 (visible in FIG. 15) that allows the end of the lower slide 57 to be received within the profile of the vertical frame member 50. An additional point of connection between the vertical frame member 50 and the lower slide 57, such as at the lower attachment location 116, can further enhance the strength of the frame structure 14. It is similarly contemplated that other attachment locations between the vertical frame members 50 and the slides 55,56,57 may be implemented at the other cutouts or cutaways 67,68 of the vertical frame members 50.

Figure 18:
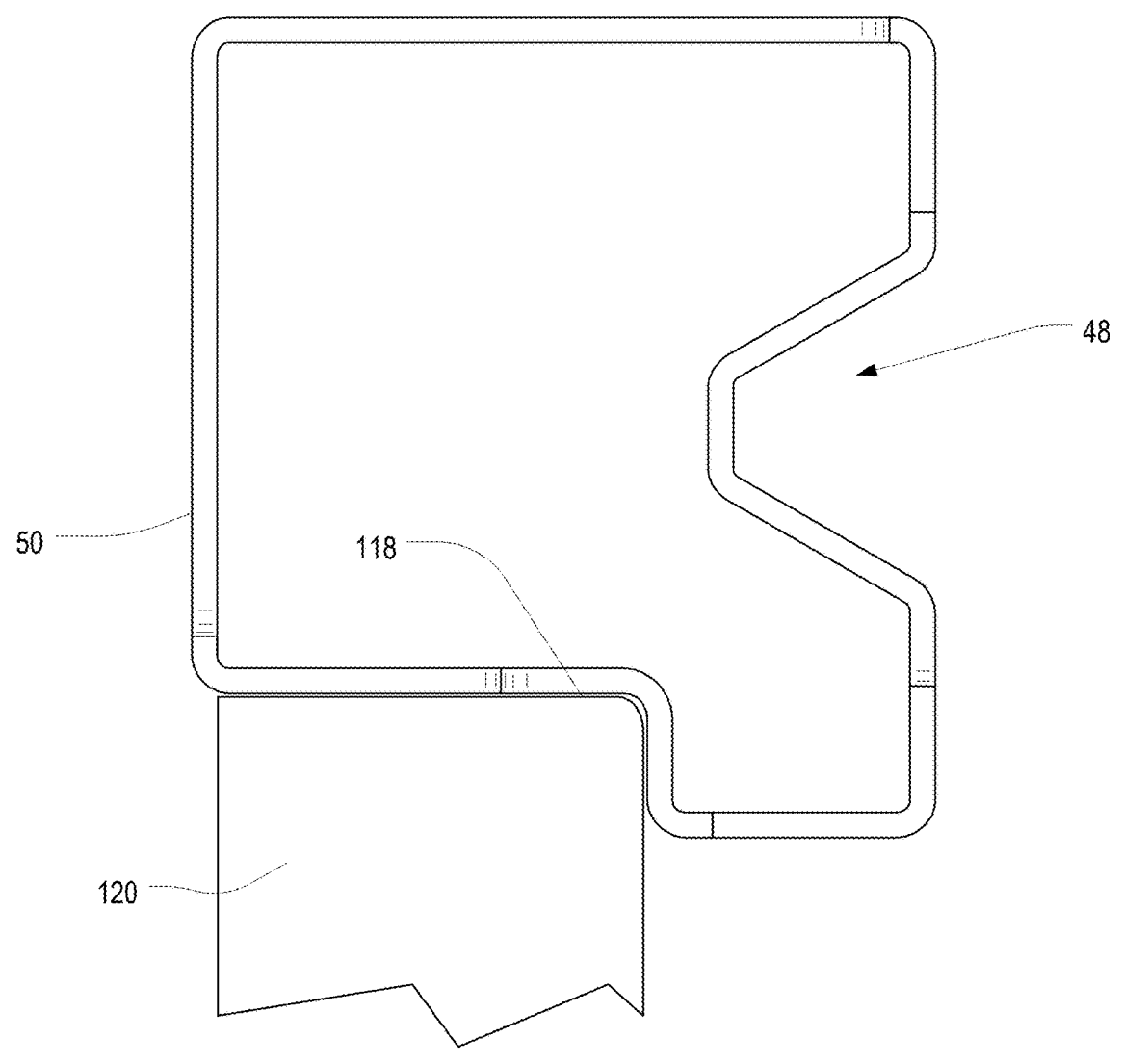
FIG. 18 is a top end view of the vertical frame member of FIG. 15, shown with a side panel installed adjacent thereto.

FIG. 18 is a top end view of the vertical frame member 50 of FIG. 15, shown with a side panel 120 installed adjacent thereto. As shown in FIGS. 16-18, the vertical frame member 50 also includes an inset area 118 along one side thereof and extending the length of the frame member 50. The inset area 118 provides a space for mounting one or more panels 120 to the frame structure 14 without the panels 120 interfering with adjacent structures. Further in this regard, it is contemplated that other frame components may likewise include an inset area for accommodating one or more panels, such as the inset area 122 of the slide 55, which is perhaps best seen in FIGS. 6 and 7. Taken together, the inset areas 118,122 provide a frame or border to which one or more panels 120 may be secured without the panels extending beyond the footprint of the frame structure 14.

Figure 19:
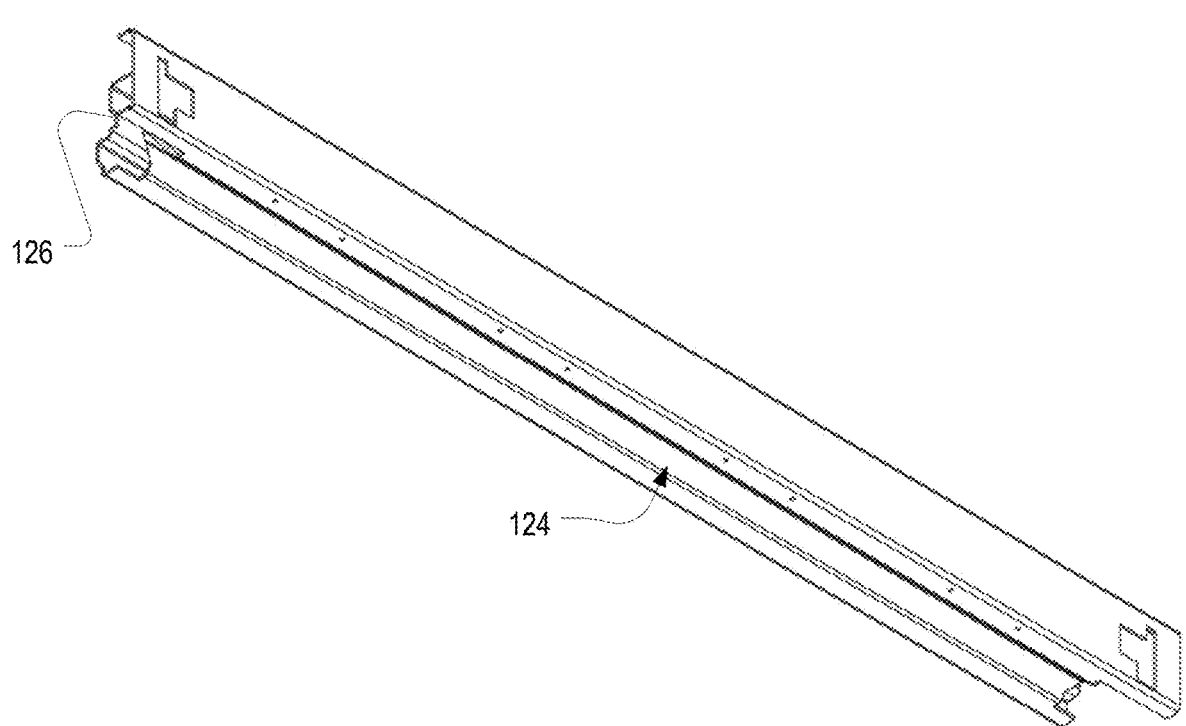
FIG. 19 is a bottom isometric view of one of the upper side-to-side lateral members of the electronic equipment enclosure of FIG. 2, shown in isolation.

FIG. 19 is a bottom isometric view of one of the upper side-to-side lateral members 51 of the electronic equipment enclosure 10 of FIG. 2, shown in isolation. Notably, it is contemplated that the upper laterals 51,53 of the frame structure 14 may have an identical cross-section to that of the vertical frame members 50. In this regard, it is contemplated that the upper laterals 51,53 may each have a roll-formed closed profile with a V-shaped channel 124 arranged along one side. It is likewise contemplated that the upper laterals 51,53 may each include an inset area 126 for accommodating one or more panels.

Figure 20:
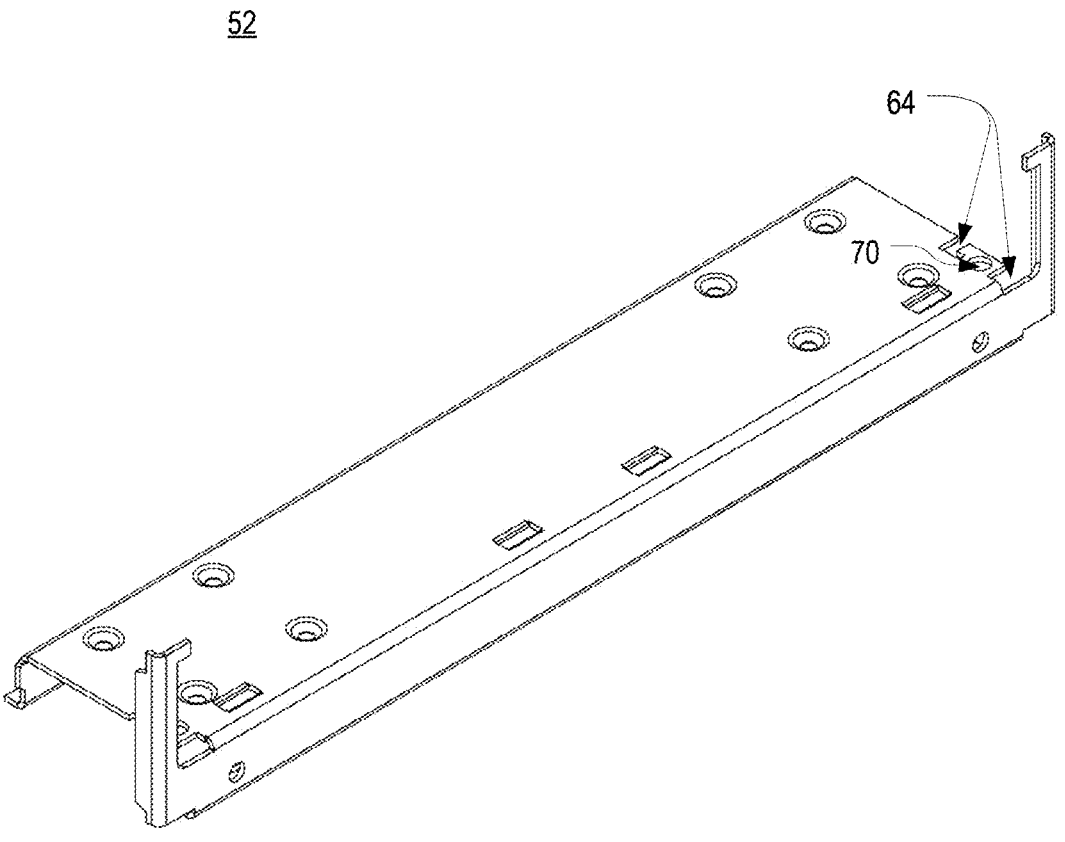
FIG. 20 is a top isometric view of the lower side-to-side lateral member of FIG. 3, shown in isolation.

FIG. 20 is a top isometric view of the lower side-to-side lateral member 52 of FIG. 3, shown in isolation. Notably, although not illustrated, it is contemplated that in alternative embodiments the lower laterals may resemble the upper lateral 51 of FIG. 19 but modified to include additional sheet metal to facilitate mounting of casters 42 to the frame structure 14. The lower laterals 52 of the frame structure 14 are preferably formed of a heavy gauge steel sheet.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claim(s) appended hereto and the equivalents thereof.

What is claimed is:

1. An electronic equipment structure comprising:

a frame structure that includes a plurality of interconnected vertical and horizontal frame members, wherein at least one of the horizontal frame members is a structural member having a closed profile that includes at least one T-slot channel and at least one recessed groove extending a length thereof, the at least one recessed groove including a row of mounting apertures arranged therein;

an accessory part including a recessed area and an elongate opening located in the recessed area, the accessory part being arranged such that the recessed area is in alignment with the at least one recessed groove of the structural member; and a fastener extending through each of the elongate opening of the accessory part and a selected one of the mounting apertures of the at least one recessed groove such that the fastener does not protrude beyond an outward-facing surface of the accessory part.

2. The electronic equipment structure of claim 1, wherein a hooking tab of the accessory part hooks over a ledge of the at least one T-slot channel.

3. The electronic equipment structure of claim 1, wherein a position of the accessory part relative to the frame structure is adjustable by shifting a position of the fastener within the elongate opening of the accessory part.

4. The electronic equipment structure of claim 1, wherein the at least one recessed groove is arranged along an interior-facing surface of the structural member.

5. The electronic equipment structure of claim 1, wherein each mounting aperture includes a boss at an interior of the closed profile of the structural member.

6. The electronic equipment structure of claim 5, wherein the fastener is a thread-forming fastener.

7. The electronic equipment structure of claim 6, wherein the thread-forming fastener penetrates a coating at an inner surface of the boss at the selected one of the mounting apertures to establish metal-on-metal contact between the thread-forming fastener and the structural member, thereby establishing an electrical bonding connection.

8. The electronic equipment structure of claim 1, wherein at least one of the vertical frame members includes a closed profile having a cutaway for receiving an end of one of the horizontal frame members.

9. The electronic equipment structure of claim 1, wherein at least some of the vertical frame members and the horizontal frame members include at least one inset area extending the length thereof.

10. The electronic equipment structure of claim 9, further comprising a plurality of panels seated within the inset areas such that the panels do not protrude beyond a footprint defined by the frame structure.

11. The electronic equipment structure of claim 1, wherein a bottom end of at least one of the vertical frame members is connected to a lower one of the horizontal frame members via a weld connection to facilitate transfer of an equipment load from the at least one vertical frame member, through the lower one of the horizontal frame members, and to a support block arranged therebeneath.

12. The electronic equipment structure of claim 1, wherein each of the vertical members includes a channel extending a length thereof for providing access to an adjustment assembly of a leveling foot.

13. The electronic equipment structure of claim 12, wherein each adjustment assembly includes a stud accessible from above the adjustment assembly, whereby rotation of the stud adjusts a position of the corresponding leveling foot.

14. The electronic equipment structure of claim 13, wherein a top-facing surface of each stud includes a hexagonal-shaped recess.

15. An electronic equipment structure comprising:

a frame structure that includes a plurality of interconnected vertical and horizontal frame members, wherein at least one of the horizontal frame members is a structural member having a closed profile that includes at least one T-slot channel and at least one recessed groove extending a length thereof;

a hardware component including an oblong head seated transversely within the at least one T-slot channel to prevent inadvertent removal therefrom, the hardware component further including a shaft extending outward from between opposed ledges of the at least one T-slot channel;

an accessory part including an elongate opening, the accessory part being arranged such that the shaft of the hardware component passes through the elongate opening; and a nut tightened on the shaft of the hardware component to secure the accessory part to the structural member.

16. The electronic equipment structure of claim 15, wherein a position of the hardware component relative to the structural member is infinitely adjustable within a range defined by the length of the structural member.

17. The electronic equipment structure of claim 15, wherein at least one of the vertical frame members includes a closed profile having a cutaway for receiving an end of one of the horizontal frame members.

18. The electronic equipment structure of claim 15, wherein at least some of the vertical frame members and the horizontal frame members include at least one inset area extending the length thereof.

19. The electronic equipment structure of claim 18, further comprising a plurality of panels seated within the inset areas such that the panels do not protrude beyond a footprint defined by the frame structure.

20. The electronic equipment structure of claim 15, wherein a bottom end of at least one of the vertical frame members is connected to a lower one of the horizontal frame members via a weld connection to facilitate transfer of an equipment load from the at least one vertical frame member, through the lower one of the horizontal frame members, and to a support block arranged therebeneath.

21. The electronic equipment structure of claim 15, wherein each of the vertical members includes a channel extending a length thereof for providing access to an adjustment assembly of a leveling foot.

22. The electronic equipment structure of claim 21, wherein each adjustment assembly includes a stud accessible from above the adjustment assembly, whereby rotation of the stud adjusts a position of the corresponding leveling foot.

23. The electronic equipment structure of claim 22, wherein a top-facing surface of each stud includes a hexagonal-shaped recess.

* * * * *